(12) United States Patent
Lyu et al.

(10) Patent No.: US 11,184,513 B2
(45) Date of Patent: *Nov. 23, 2021

(54) SYSTEM, METHOD AND DEVICE FOR CONTROLLING ELECTRONIC DEVICE AND ITS TARGET CAMERA AND LASER PROJECTOR

(71) Applicant: GUANGDONG OPPO MOBILE TELECOMMUNICATIONS CORP., LTD., Guangdong (CN)

(72) Inventors: Xiangnan Lyu, Guangdong (CN); Jian Bai, Guangdong (CN); Biao Chen, Guangdong (CN); Haitao Zhou, Guangdong (CN); Ziqing Guo, Guangdong (CN); Guohui Tan, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/742,384

(22) Filed: Jan. 14, 2020

(65) Prior Publication Data

US 2020/0154015 A1 May 14, 2020

Related U.S. Application Data

(63) Continuation of application No. PCT/CN2019/082699, filed on Apr. 15, 2019.

(30) Foreign Application Priority Data

Apr. 28, 2018 (CN) .................. 201810401330.X
May 30, 2018 (CN) .................. 201810539290.5

(Continued)

(51) Int. Cl.
*H04N 5/225* (2006.01)
*G06T 7/521* (2017.01)
(Continued)

(52) U.S. Cl.
CPC ........... *H04N 5/2256* (2013.01); *G06T 7/521* (2017.01); *H04N 5/23203* (2013.01);
(Continued)

(58) Field of Classification Search
CPC ............. H04N 5/2256; H04N 5/23203; H04N 17/002; H04N 5/232; H04N 5/235;
(Continued)

(56) References Cited

U.S. PATENT DOCUMENTS 10,132,616 B2 * 11/2018 Wang ..................... H04N 5/378
2003/0079163 A1 * 4/2003 Hashimoto ........... G06F 11/079
714/55

(Continued)

FOREIGN PATENT DOCUMENTS

CN       1926727 A     3/2007
CN     101527826 A     9/2009
(Continued)

OTHER PUBLICATIONS

OA with English translation for CN application 201810401330.X.
(Continued)

*Primary Examiner* — Richard A Hansell, Jr.
(74) *Attorney, Agent, or Firm* — Young Basile Hanlon & MacFarlane, P.C.

(57) ABSTRACT

Embodiments of the present disclosure provide a system for controlling a camera component, the camera component is applicable for an electronic device, and the system may include a first processing unit and a target processing unit. The target processing unit is configured to control the camera component. The first processing unit is configured to (Continued)

determine whether the target processing unit writes data to the first processing unit in accordance with a preset time interval, and when the target processing unit does not write data to the first processing unit over the preset time interval, change an operating state of the camera component and/or control the electronic device to restart.

17 Claims, 20 Drawing Sheets

(30) Foreign Application Priority Data

| May 30, 2018 | (CN) | ..................... 201810540383.X |
|---|---|---|
| May 30, 2018 | (CN) | ..................... 201810540384.4 |
| May 30, 2018 | (CN) | ..................... 201810540685.7 |
| May 30, 2018 | (CN) | ..................... 201810541727.9 |
| May 30, 2018 | (CN) | ..................... 201810541887.3 |

(51) Int. Cl.
  *H04N 5/232* (2006.01)
  *H04N 17/00* (2006.01)
  *G06K 9/00* (2006.01)

(52) U.S. Cl.
  CPC ....... *H04N 17/002* (2013.01); *G06K 9/00221* (2013.01); *G06T 2207/10028* (2013.01); *G06T 2207/10048* (2013.01); *G06T 2207/30201* (2013.01)

(58) Field of Classification Search
  CPC .......... H04N 5/247; H04N 5/33; H04N 17/00; G06T 7/521; G06T 2207/10028; G06T 2207/10048; G06T 2207/30201; G06K 9/00221; G06F 1/1686; G06F 1/3206; G01B 11/25; G05B 19/042; H01S 5/042; H04M 1/02; H04M 1/725
  See application file for complete search history.

(56) References Cited

U.S. PATENT DOCUMENTS

| 2009/0109299 | A1 | 4/2009 | Nishiguchi et al. | |
| 2010/0182311 | A1* | 7/2010 | Kim ..................... | H04N 13/254 345/419 |
| 2012/0257065 | A1 | 10/2012 | Velarde et al. | |
| 2013/0204112 | A1 | 8/2013 | White et al. | |
| 2017/0105020 | A1 | 4/2017 | Wajs et al. | |
| 2018/0131160 | A1* | 5/2018 | Zhang ..................... | H01S 5/183 |
| 2018/0131880 | A1* | 5/2018 | Hicks ..................... | H04N 5/33 |

FOREIGN PATENT DOCUMENTS

| CN | 201937738 U | 8/2011 | | |
| CN | 102411702 A | 4/2012 | | |
| CN | 103327241 A | 9/2013 | | |
| CN | 105786657 A | 7/2016 | | |
| CN | 106452599 A | 2/2017 | | |
| CN | 106454287 A | 2/2017 | | |
| CN | 107105217 A | 8/2017 | | |
| CN | 107122032 A | 9/2017 | | |
| CN | 107424187 A | 12/2017 | | |
| CN | 107608167 A | 1/2018 | | |
| CN | 107729836 A | 2/2018 | | |
| CN | 108683843 A | 10/2018 | | |
| CN | 108711734 A | 10/2018 | | |
| CN | 108736312 A | 11/2018 | | |
| CN | 108736313 A | 11/2018 | | |
| CN | 108762147 A | 11/2018 | | |
| CN | 108769413 A | 11/2018 | | |
| CN | 108848207 A | 11/2018 | | |
| JP | 2006120102 A | * | 5/2006 | |
| KR | 20150051349 A | * | 5/2015 | |
| KR | 101623920 B1 | * | 5/2016 | |
| WO | 2009139193 A1 | | 11/2009 | |
| WO | WO-2017161684 A1 | * | 9/2017 | .............. G06F 11/20 |

OTHER PUBLICATIONS

OA with English translation for CN application 201810540685.7.
OA with English translation for CN application 201810541727.9.
OA with English translation for CN application 201810540384.4.
OA with English translation for CN application 201810539290.5.
OA with English translation for CN application 201810540383.X.
OA with English translation for CN application 201810541887.3.
SR with English translation for PCT application PCT/CN2019/082699.
English translation of OA for CN application 201810540383.X mailed Jun. 15, 2020.
English translation of OA for CN application 201810541727.9 mailed Jun. 15, 2020.
English translation of OA for CN application 201810540384.4 dated Feb. 17, 2020.
English translation of OA for CN application 201810539290.5 dated Feb. 14, 2020.
English translation of OA for CN application 201810540383.X dated Feb. 14, 2020.
English translation of OA for CN application 201810541887.3 dated Feb. 14, 2020.
English translation of OA for CN application 201810540685.7 dated Feb. 14, 2020.
English translation of OA for CN application 201810541727.9 dated Feb. 14, 2020.
Office Action for EP Application 19793410.2 dated Oct. 2, 2020.
3D modeling of human faces—A survey; M. Judith Leo and D. Manimegalai; pp. 40-45.
Extended European Search Report for EP Application 19793410.2 dated Feb. 3, 2021. (19 pages).
Australian Examination Report for AU Application 2019277762 dated Aug. 23, 2021. (6 pages).

* cited by examiner

SYSTEM, METHOD AND DEVICE FOR CONTROLLING ELECTRONIC DEVICE AND ITS TARGET CAMERA AND LASER PROJECTOR

CROSS-REFERENCE TO RELATED APPLICATION(S)

This application is a continuation application of International Patent Application No. PCT/CN2019/082699, filed on Apr. 15, 2019, which claims priority to and benefits of Chinese patent application Serial Nos. 201810539290.5, 201810541727.9, 201810540685.7, 201810541887.3, 201810540384.4 and 201810540383.X, all filed on May 30, 2018, and Chinese patent application Serial No. 201810401330.X, filed on Apr. 28, 2018, the entire contents of all of which are incorporated herein by reference in their entireties.

TECHNICAL FIELD

The present disclosure relates to a field of consumer electronics, and more particularly, to a system for controlling a camera component, a method for controlling a camera component, a device for controlling a camera component, an electronic device, and a computer readable storage medium.

BACKGROUND

With the rapid development of face recognition technologies and structured light, face unlocking and face payment are applied widely in electronic devices. In scenes such as face unlocking or face payment, the electronic device needs to emit laser light through a laser projector, and constructs 3D face information according to the reflected laser light. However, the laser light emitted from the laser projector is harmful to the human eyes.

SUMMARY

Embodiments of the present disclosure provide a system for controlling a camera component. The camera component is applicable for an electronic device. The system includes a first processing unit and a target processing unit. The target processing unit is configured to control the camera component. The first processing unit is configured to determine whether the target processing unit writes data to the first processing unit in accordance with a preset time interval, and change an operating state of the camera component and/or reboot the electronic device, in response to that the target processing unit does not write data to the first processing unit over the preset time interval.

Embodiments of the present disclosure provide an electronic device. The electronic device includes a camera component and a system for controlling the camera component. The camera component includes a target camera and a laser projector. The system includes a target processing unit and a first processing unit. The target processing unit includes a first driving circuit and a microprocessor. The first processing unit includes a watchdog timer. The first driving circuit is coupled to the laser projector. The microprocessor is coupled to the first driving circuit and configured to control the first driving circuit to drive the laser projector to project laser light. The watchdog timer is coupled to the first driving circuit, and configured to receive a predetermined signal from the microprocessor, and turn off the first driving circuit to turn off the laser projector and transmit a reset signal for resetting the target camera to the microprocessor in response to that the predetermined signal is not received within a preset time interval. The microprocessor is configured to reset the target camera based on the reset signal for resetting the target camera from the watchdog timer.

Embodiments of the present disclosure provide a method for controlling a camera component. The camera component is applicable for an electronic device. The method includes: receiving data; and changing an operating state of the camera component and/or rebooting in response to determining that the data is not received within a preset time interval.

Additional aspects and advantages of the present disclosure will be given in the following description, some of which will become apparent from the following description or be learned from practices of the present disclosure.

BRIEF DESCRIPTION OF DRAWINGS

The above and/or additional aspects and advantages of the present disclosure will become apparent and easy to understand from descriptions of the embodiments with reference to the drawings, in which.

DETAILED DESCRIPTION

Figure 1:
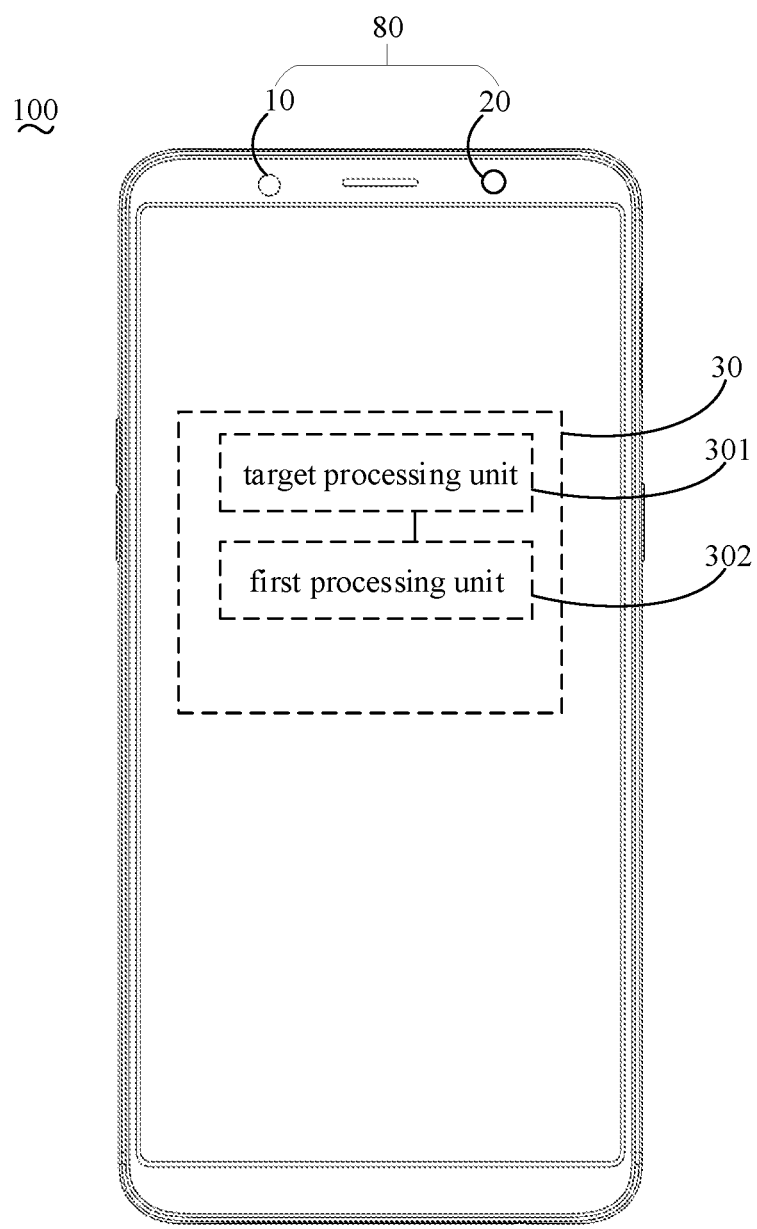
FIG. 1 is a schematic diagram of an electronic device according to embodiments of the present disclosure.

Embodiments of the present disclosure will be described in detail with reference to drawings. The same or similar elements or the elements having the same or similar functions are denoted by like reference numerals throughout the descriptions.

Embodiments described herein with reference to drawings are explanatory, serve to explain the present disclosure, and are not construed to limit the present disclosure.

In the present disclosure, unless specified or limited otherwise, the first characteristic is "on" or "under" the second characteristic refers to the first characteristic and the second characteristic may be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

As illustrated in FIG. 1, an electronic device 100 according to embodiments of the present disclosure includes a camera component 80 and a control system 30. The camera component 80 includes a laser projector 10 and an infrared camera 20. The control system 30 includes a first processing unit 302 and a target processing unit 301. The target processing unit 301 is configured to control the camera component 80. The first processing unit 302 is configured to determine whether the target processing unit 301 writes data to the first processing unit 302 in accordance with a preset time interval. The first processing unit 302 is configured to, change an operating state of the camera component 80 and/or reboot the electronic device 100, in response to that the target processing unit 301 does not write data to the first processing unit 302 over the preset time interval.

Figure 2:
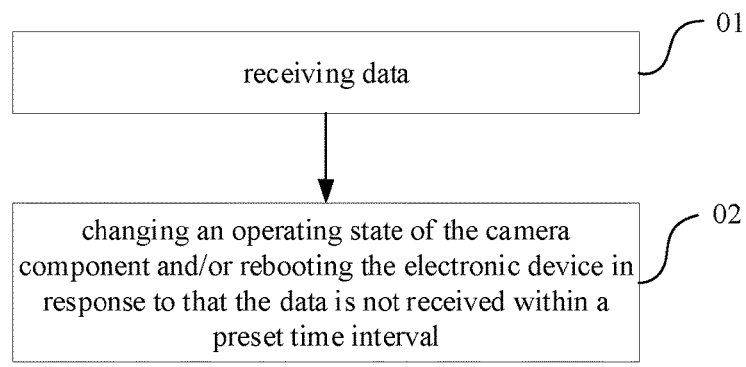
FIG. 2 is a flow chart of a method for controlling a camera component according to embodiments of the present disclosure.

As illustrated in FIGS. 1 and 2, the method for controlling the camera component 80 (or the method for controlling the electronic device 100) according to the embodiments of the present disclosure includes the following operations.

At block 01, data is received.

At block 02, in response to determining that the data is not received within a preset time interval, an operating state of the camera component 80 is changed and/or the electronic device 100 is rebooted.

A system for controlling the camera component 80, a method for controlling the camera component 80, a device for controlling the camera component 80, the electronic device 100, and a computer readable storage medium 1000 according to the embodiments of the present disclosure will be described below.

Figure 3:
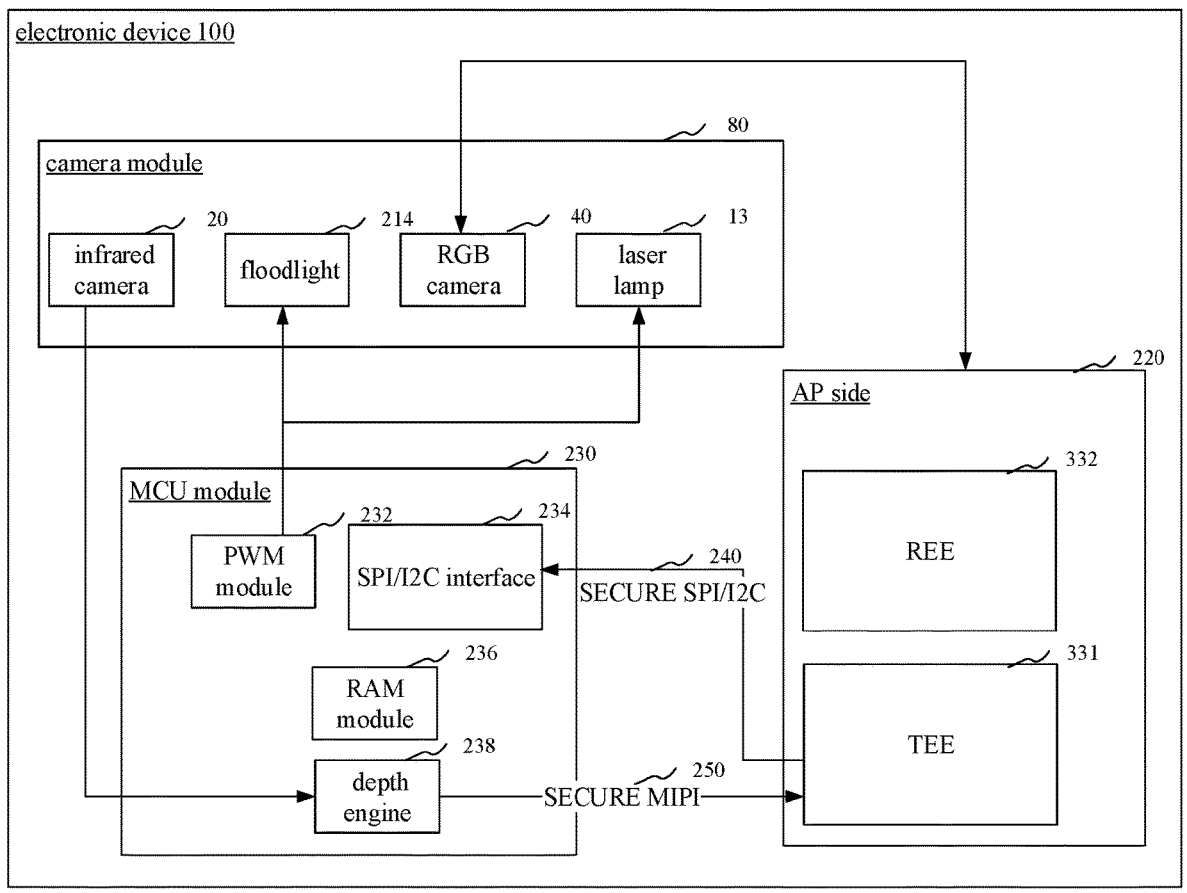
FIG. 3 is a block diagram of an electronic device according to embodiments of the present disclosure.

FIG. 3 is a schematic diagram of an electronic device in an embodiment. As illustrated in FIG. 3, the electronic device 100 may include a camera component 80, an AP (application processor) side 220, and an MCU (microcontroller unit) chip 230.

The AP side 220 may be a CPU (central processing unit) in the electronic device 100. The MCU chip 230 is coupled between the AP side 220 and the camera component 80. The MCU chip 230 may control the infrared camera 20, the floodlight 214, and the laser lamp (i.e., light source) 13 in the camera component 80. The AP side 220 may control the RGB (Red/Green/Blue color mode) camera (i.e., visible-light camera) 40 in the camera component 80.

The camera component 80 includes the infrared camera 20, the floodlight 214, the RGB camera 40, and the laser lamp 13. The infrared camera 20 is configured to acquire an infrared image. The floodlight 214 is a point light source that emits infrared light. The laser lamp 13 is a patterned point light source that capable of emitting laser light. When the floodlight 214 emits a point light source, the infrared camera 20 may acquire an infrared image according to the reflected light. When the laser lamp 13 emits a point light source, the infrared camera 20 may acquire a speckle image according to the reflected light. The speckle image is an image deformed after the patterned point light source emitted by the laser lamp 13 is reflected.

The AP side 220 may include a CPU core running in a TEE (Trusted Execution Environment) 331 and a CPU core running in a REE (Rich Execution Environment) 332. The TEE 331 and the REE 332 are both operating modes of an ARM (Advanced RISC Machines) module. The security level of the TEE 331 is relatively high. Only one CPU core at the AP side 220 may run in the TEE 331 at the same time. Generally, an operation behavior of higher-level security in the electronic device 100 needs to be performed in the CPU core in the TEE 331, and an operation behavior of lower-level security may be performed in the CPU core in the REE 332.

The MCU chip 230 includes a PWM (Pulse Width Modulation) module 232, a SPI/I2C (Serial Peripheral Interface/Inter-Integrated Circuit) interface 234, a RAM (Random Access Memory) module 236 and a depth engine 238. The PWM module 232 may transmit a pulse to the camera component 80 to control the floodlight 214 or the laser lamp 13 to be turned on, so that the infrared camera 20 may acquire an infrared image or a speckle image. The SPI/I2C interface 234 is configured to receive an image acquisition instruction transmitted by the AP side 220. The depth engine 238 may process the speckle image to acquire a depth disparity map.

In response to that the AP side 220 receives a data acquisition request from the application program, for example, when the application program needs to perform face unlocking and face payment, the application may send the data acquisition request to the AP side 220, the CPU core running in the TEE 331 may transmit an image acquisition instruction to the MCU chip 230. After receiving the image acquisition instruction, the MCU chip 230 may transmit a pulse wave through the PWM module 232 to control the floodlight 214 in the camera component 80 to be turned on, collect the infrared image through the infrared camera 20, control the laser lamp 13 in the camera component 80 to be turned on, and collect the speckle image through the infrared camera 20. The camera component 80 may transmit the collected infrared image and speckle image to the MCU chip 230. The MCU chip 230 may process the received infrared image to acquire an infrared disparity map, and process the received speckle image to acquire a speckle disparity map or a depth disparity map. The processing on the infrared image and the speckle image by the MCU chip 230 refers to correcting the infrared image or the speckle image, and removing the influence of the internal and external parameters of the camera component 80 on the image. The MCU chip 230 may be set to different modes, and the images output by different modes are different. When the MCU chip 230 is set to the speckle mode, the MCU chip 230 processes the speckle image to acquire a speckle disparity map, and a target speckle image may be acquired according to the speckle disparity map; when the MCU chip 230 is set to the depth mode, the MCU chip 230 processes the speckle image to acquire a depth disparity map, and a depth image may be acquired according to the depth disparity map, and the depth image refers to an image with depth information. The MCU chip 230 may transmit the infrared disparity map and the speckle disparity map to the AP side 220. The MCU chip 230 may also transmit the infrared disparity map and the depth disparity map to the AP side 220. The AP side 220 may acquire a target infrared image according to the infrared disparity map described above, and acquire a depth image according to the depth disparity map. Further, the AP side 220 may perform face recognition, face matching, liveliness detection, and may acquire depth information of the detected face, according to the target infrared image and the depth image.

Communication between the MCU chip 230 and the AP side 220 is through a fixed security interface to ensure the security of the transmitted data. As illustrated in FIG. 3, the AP side 220 transmits data to the MCU chip 230 through the SECURE SPI/I2C 240, and the MCU chip 230 transmits data to the AP side 220 through the SECURE MIPI (Mobile Industry Processor Interface) 250.

In an embodiment, the MCU chip 230 may also acquire the target infrared image according to the infrared disparity map, calculate the depth image according to the depth disparity map, and transmit the target infrared image and the depth image to the AP side 220.

In an embodiment, the MCU chip 230 may perform face recognition, face matching, liveliness detection, and may acquire depth information of the detected face, according to the target infrared image and the depth image. The MCU chip 230 transmits the image to the AP side 220, which refers to that the MCU chip 230 transmits the image to the CPU core in the TEE 331 at the AP side 220.

The electronic device 100 in the embodiments of the present disclosure may be a mobile phone, a tablet computer, a personal digital assistant, a wearable device, or the like.

Figure 4:
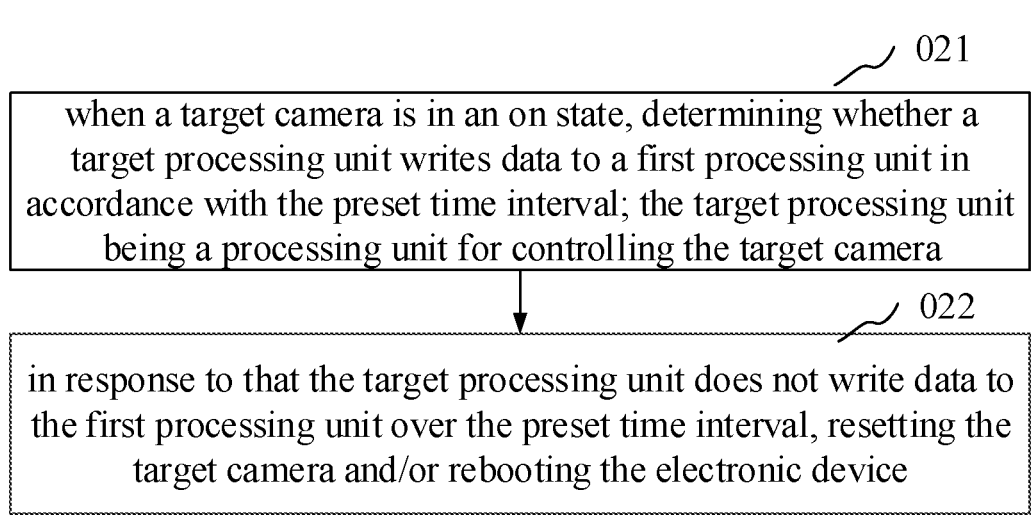
FIG. 4 is a flow chart of a method for controlling a camera component according to embodiments of the present disclosure.

FIG. 4 illustrates a method for controlling an electronic device in an embodiment. As illustrated in FIGS. 1 and 4, the method for controlling an electronic device includes the following operations.

At block 021, when a target camera is in an on state, it is determined whether the target processing unit 301 writes data to the first processing unit 302 in accordance with the preset time interval. The target processing unit 301 is a processing unit for controlling the target camera.

At block 022, in response to that the target processing unit 301 does not write data to the first processing unit 302 over the preset time interval, the target camera is reset and/or the electronic device is rebooted.

The act at block 021 and the act at block 022 may be sub-acts of the act at block 02.

When the application program in the electronic device 100 needs to acquire the face data, the target camera is controlled to be turned on to collect a target image. The target camera may refer to the laser camera in the camera component 80, and the laser camera may collect invisible-light images of different wavelengths, such as the infrared camera 20. The target image may include, but be not limited to, an infrared image, and a speckle image. The speckle image refers to an infrared image with speckle(s). The electronic device 100 turns on the floodlight 214 in the camera component 80 and collects the infrared image through the laser camera, and turns on the laser module such as the laser lamp 13 in the camera component 80 and collects the speckle image through the laser camera. The floodlight 214 may be a point light source that uniformly illuminates in all directions. The light emitted by the floodlight 214 may be infrared light, and the laser camera may collect a human face to acquire the infrared image. The laser light emitted by the laser module may be diffracted by a lens and a DOE (Diffractive Optical Elements) to produce a pattern with speckle particles, and is projected onto a target object by the pattern with speckle particles. The offset of the pattern with speckle particles is generated by distances between the points of the target object and the electronic device 100, and the laser camera collects the target object to acquire the speckle image.

The electronic device 100 controls the target camera to be turned on, and controls the laser module to be turned on to emit laser light, so that the target image may be collected by the target camera. The laser light emitted by the laser module, when directly illuminating the human eyes, may be harmful to the human eyes. The electronic device 100 may set a first processing unit 302 to determine whether the target processing unit 301 writes data to the first processing unit 302 in accordance with the preset time interval. The first processing unit 302 is a processing unit for monitoring the running state of the target processing unit 301. When the target processing unit 301 runs normally, the target processing unit 301 writes data to the first processing unit 302 in accordance with the preset time interval. When the target processing unit 301 runs abnormally, the target processing unit 301 stops writing data to or writes "data time-out" to the first processing unit 302 due to interruption of normal operation of the application program or failure of normal operation of the application program, that is, whether the target processing unit 301 is normally operated, may be detected by monitoring whether the target processing unit 301 writes data to the first processing unit 302 in accordance with the preset time interval.

Figure 5:
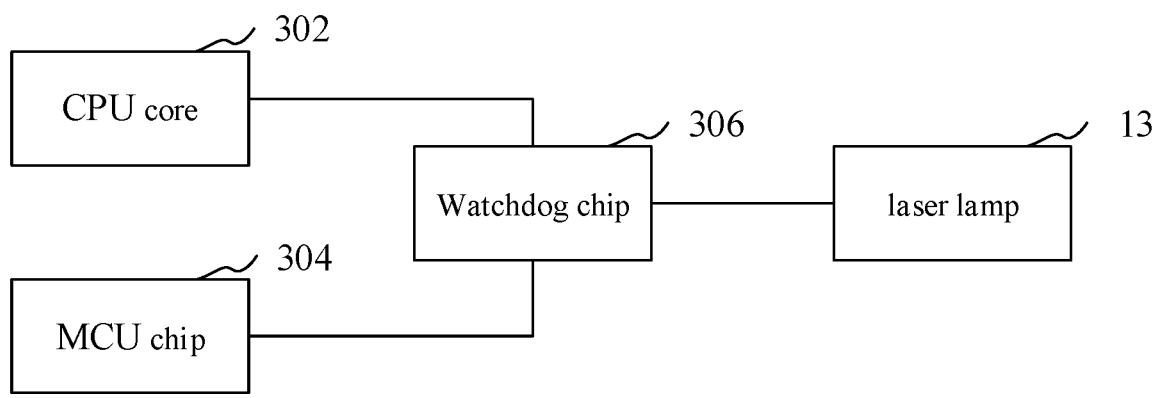
FIG. 5 is a block diagram of an electronic device according to embodiments of the present disclosure.

As illustrated in FIG. 5, alternatively, the first processing unit 302 may be a watchdog chip 306. The watchdog chip 306 is a timer circuit. When the target processing unit 301 operates normally, the target processing unit 301 outputs a signal to the watchdog chip 306 in accordance with the preset time interval. If the target processing unit 301 has not output the signal to the watchdog chip 306 over the preset time interval, the watchdog chip 306 will issue a reset signal to cause the laser camera to reset and/or the electronic device 100 to reboot. The target processing unit 301 may be an MCU chip 304 coupled to the laser camera, and the target processing unit 301 may also be the CPU core 302 of processing the image. Since the MCU chip 304 is directly coupled to the laser camera, the laser camera is controlled to be turned on and off by the MCU chip 304; the CPU core 302 is coupled to the MCU chip 304 for transmitting instructions to the MCU chip 304 and performing data interaction with the MCU chip 304. Therefore, the abnormality of the CPU core 302 or the MCU chip 304 may cause the laser camera to be abnormal, and the abnormality of the laser camera such as the laser module being turned on for a long period of time, may cause damage to the human eyes. Therefore, when the laser camera is abnormal, the watchdog chip 306 may issue a reset signal to reset the laser camera and/or reboot the electronic device 100, to prevent the laser camera from causing damage to the human eyes when it is turned on for the long period of time. Resetting the laser camera refers to restoring the laser camera to an initial state, and rebooting the electronic device 100 refers to performing a complete reboot on the electronic device 100.

As illustrated in FIG. 5, the CPU core 302 and the MCU chip 304 are coupled in parallel with the watchdog chip 306. When the CPU core 302 is operating normally, the CPU core 302 may transmit data to the watchdog chip 306 in accordance with the preset first time interval, that is, to feed the dog; when the MCU chip 304 is operating normally, the MCU chip 304 may transmit data to the watchdog chip 306 in accordance with the preset second time interval. When at least one of the CPU core 302 and the MCU chip 304 is abnormal, the watchdog chip 306 disconnects the circuit connection with the laser lamp 13 in the laser module, so that the laser lamp 13 is powered off and cannot emit laser light, such that the laser lamp 13 is prevented from emitting laser light for the long period of time to cause damage to the human eyes.

In the embodiments of the present disclosure, the electronic device 100 monitors whether the target processing unit 301 is operating normally by monitoring whether the target processing unit 301 writes data to the first processing unit 302 in accordance with the preset time interval. When the target processing unit 301 is abnormal, the target camera is reset or the electronic device 100 is controlled to reboot, such that the target camera is prevented from emitting laser light for the long period of time to cause damage to the human eyes, thereby reducing the risk of the target camera causing damage to the human eyes.

In an embodiment, controlling the target camera to reset includes: disconnecting a circuit connection between the first processing unit 302 and the laser module in the target camera to turn off the laser module.

The first processing unit 302 is connected electrically to the laser module in the target camera. In response to that the target processing unit 301 writes data to the first processing unit 302 in accordance with the preset time interval, the first processing unit 302 is connected to the laser module in the target camera to make the laser module in the target camera work normally. In response to that the target processing unit 301 does not write data to the first processing unit 302 over the preset time interval, the first processing unit 302 may disconnect the circuit connection with the laser module in the target camera, so that the laser module is turned off. For example, the time interval at which the target processing unit 301 writes data to the first processing unit 302 may be set to 30 milliseconds. When the target processing unit 301 operates normally, the target processing unit 301 writes data to the first processing unit 302 every 30 milliseconds. In response to that the target processing unit 301 does not write data to the first processing unit 302 when exceeding 30 milliseconds, the first processing unit 302 may disconnect the circuit connection with the laser module in the target camera, so that the laser module in the target camera is powered off and reset. In detail, the first processing unit 302 may be connected electrically to the laser lamp in the laser module. In response to that the target processing unit 301 does not write data to the first processing unit 302 when exceeding the preset time interval, the first processing unit 302 may disconnect the circuit connection with the laser lamp 13 in the laser module, so that the laser lamp 13 in the laser module may no longer emit laser light.

In the method of the embodiments of the present disclosure, the electronic device 100 disconnects the circuit connection between the laser module in the target camera and the first processing unit 302 to reset the laser module in the target camera. When the electronic device 100 is abnormal, the laser module in the target camera may be prevented from being turned on for the long period of time to cause the laser light to illuminate the human eyes for the long period of time and endanger the health of the human eyes.

Figure 6:
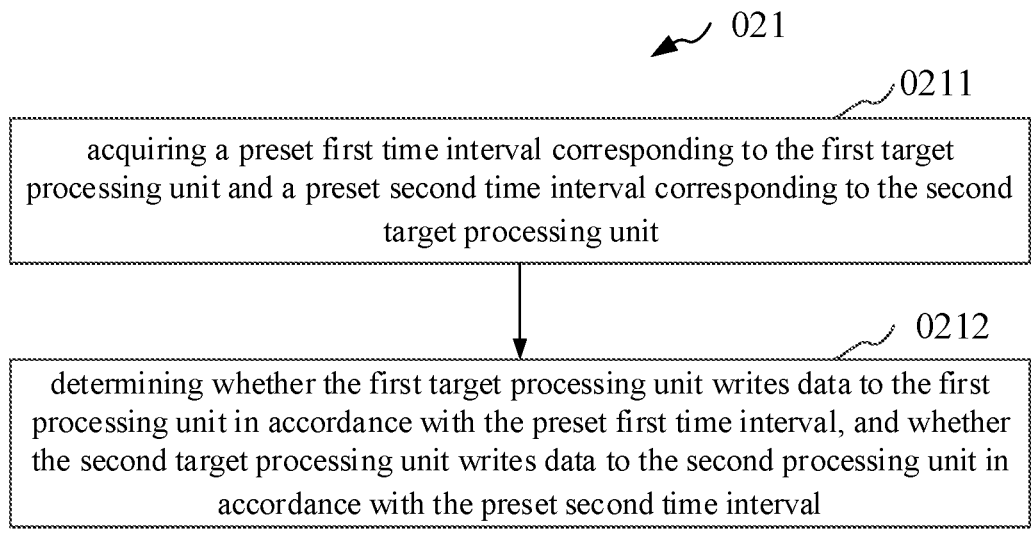
FIGS. 6-10 are flow charts of a method for controlling a camera component according to embodiments of the present disclosure.

As illustrated in FIG. 6, in one embodiment, the target processing unit 301 includes a first target processing unit and a second target processing unit, coupled in parallel to the first processing unit 302. At block 021, it is determined whether the target processing unit 301 writes data to the first processing unit 302 in accordance with the preset time interval, which includes the following.

At block 0211, a preset first time interval corresponding to the first target processing unit and a preset second time interval corresponding to the second target processing unit are acquired.

At block 0212, it is determined whether the first target processing unit writes data to the first processing unit 302 in accordance with the preset first time interval, and whether the second target processing unit writes data to the second processing unit in accordance with the preset second time interval.

The above-described target processing unit 301 may include the first target processing unit and the second target processing unit, coupled in parallel to the first processing unit 302. The first target processing unit and the second target processing unit may both control the target camera, and the abnormality of the first target processing unit or the second target processing unit may cause the target camera to be abnormal. The electronic device 100 may set a corresponding first time interval to the first target processing unit, and set a corresponding second time interval to the second target processing unit. The electronic device 100 may separately monitor whether the first target processing unit writes data to the first processing unit 302 in accordance with the preset first time interval, and whether the second target processing unit writes data to the first processing unit 302 in accordance with the preset second time interval. The first time interval and the second time interval may be the same value or different values, such as 30 milliseconds, 50 milliseconds, and the like. As illustrated in FIG. 5, it is assumed that the first target processing unit is the CPU core 302, the second target processing unit is the MCU chip 304, and the first processing unit 302 is the watchdog chip 306. The CPU core 302 and the MCU chip 304 are coupled to the watchdog chip 306 in parallel. The CPU core 302 writes data to the watchdog chip 306 in accordance with the preset first time interval, and the MCU chip 304 writes data to the watchdog chip 306 in accordance with the preset second time interval. The electronic device 100 may separately monitor the time interval during which the CPU core 302 writes data to the watchdog chip 306 and the time interval during which the MCU chip 304 writes data to the watchdog chip 306 to determine whether the CPU core 302 and the MCU chip 304 operate normally. When any of the CPU core 302 and the MCU chip 304 is not functioning properly, the watchdog chip 306 may control the target camera to reset and/or control the electronic device 100 to reboot.

Figure 7:
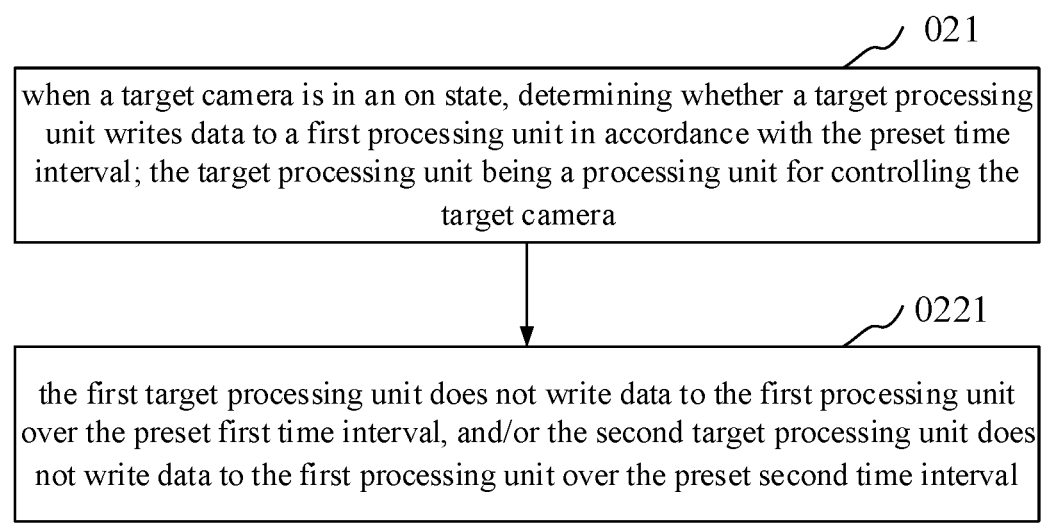

As illustrated in FIG. 7, in an embodiment, at block 022: the target processing unit 301 does not write data to the first processing unit 302 over the preset time interval, which includes that: an act at block 0221, the first target processing unit does not write data to the first processing unit 302 over the preset first time interval, and/or the second target processing unit does not write data to the first processing unit 302 over the preset second time interval.

The electronic device 100 may monitor whether the first target processing unit writes data to the first processing unit 302 in accordance with the preset first time interval, and whether the second target processing unit writes data to the first processing unit 302 in accordance with the preset second time interval. If the first target processing unit does not write data to the first processing unit 302 over the preset first time interval, or the second target processing unit does not write data to the first processing unit 302 over the preset second time interval, or the first target processing unit does not write data to the first processing unit 302 over the preset first time interval and the second target processing unit does not write data to the first processing unit 302 over the preset second time interval, the first processing unit 302 may control the target camera to reset and/or control the electronic device to reboot. In other words, when any one of the first target processing unit and the second target processing unit is abnormal, the first processing unit 302 may control the target camera to reset and/or control the electronic device to reboot, so as to prevent the target camera from being abnormal and causing the laser module to be turned on for the long period of time to damage the human eyes.

In the method of the embodiments of the present disclosure, the electronic device may separately monitor whether a plurality of target processing units 301 coupled to the first processing unit 302 are operating normally. When at least one of the plurality of target processing units 301 is abnormal, the target camera is controlled to reset or the electronic device is controlled to reboot, to reduce the risk of damaging the human eyes caused by long-time illumination of the laser light if the target camera is abnormal.

Figure 8:
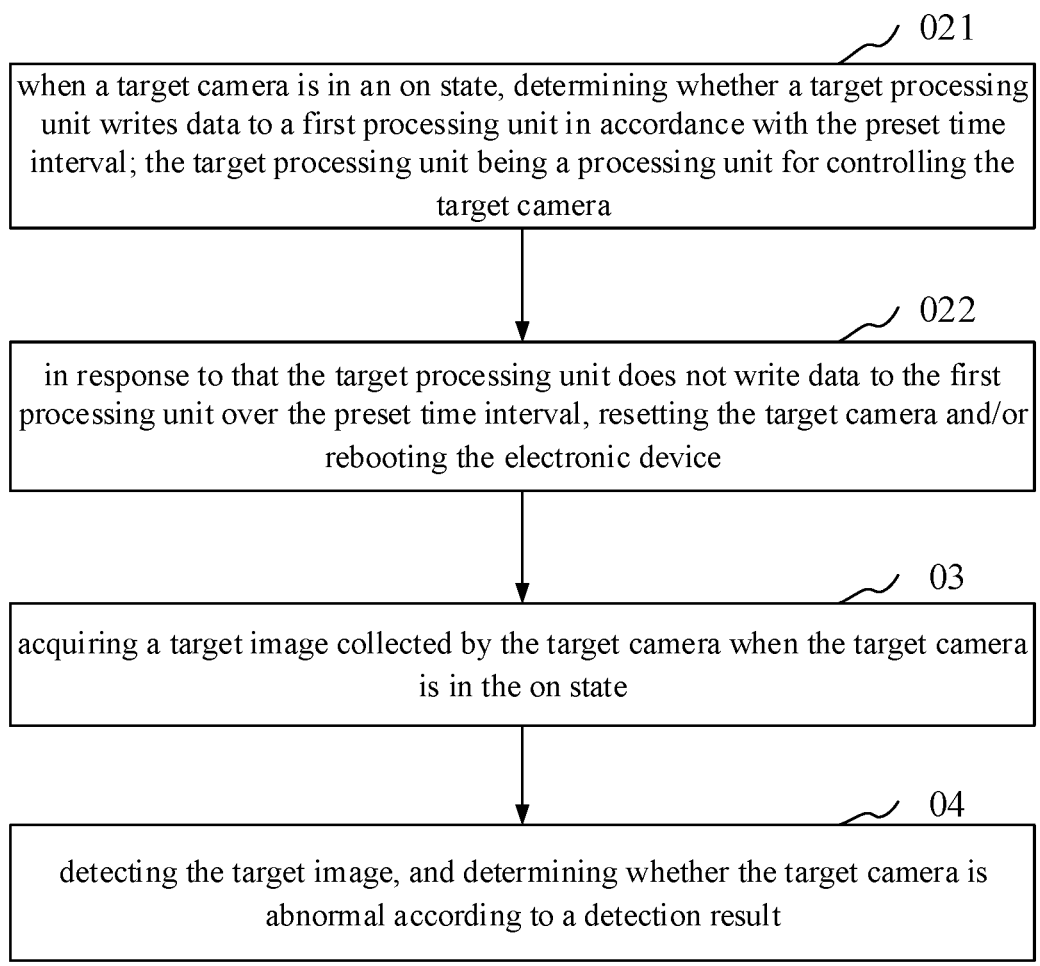

As illustrated in FIG. 8, in one embodiment, after controlling the target camera to reset and/or controlling the electronic device to reboot, the method further includes the following operations.

At block 03, when the target camera is in the on state, a target image collected by the target camera is acquired.

At block 04, the target image is detected, and it is determined whether the target camera is abnormal based on a detection result.

After the first processing unit 302 controls the target camera to reset and/or controls the electronic device 100 to reboot, the electronic device 100 may detect whether the target camera is abnormal, and may turn off the target camera when the target camera is abnormal. Alternatively, after the target camera is reset and/or the electronic device 100 is controlled to reboot, when the target camera is in the on state, the target image collected by the target camera may be acquired. The above target image is a speckle image collected by the target camera. After acquiring the speckle image, the electronic device 100 may detect whether the laser camera is abnormal according to the speckle image. Alternatively, the electronic device 100 may detect whether the speckle image is a normal speckle image according to the brightness of each region of the speckle image. If the speckle image is not the normal speckle image, the laser module in the laser camera is abnormal. The electronic device 100 may control the laser module to be turned off. For example, DOE perforation, DOE shedding, or DOE scratching in the laser module, may cause the brightness of a certain region in the collected speckle image to be abnormal, and the electronic device 100 may quickly determine whether the laser module is abnormal by using the collected speckle image. Alternatively, the electronic device 100 may collect the target image every time the target camera is turned on, and determine whether the target camera is abnormal according to the target image.

The method in the embodiments of the present disclosure may determine whether the target camera is abnormal when the target camera is in the on state, and quickly turn off the target camera when the target camera is determined to be abnormal, so as to prevent the laser light emitted by the target camera from directly illuminating the human eyes and causing damage to the human eyes.

Figure 9:
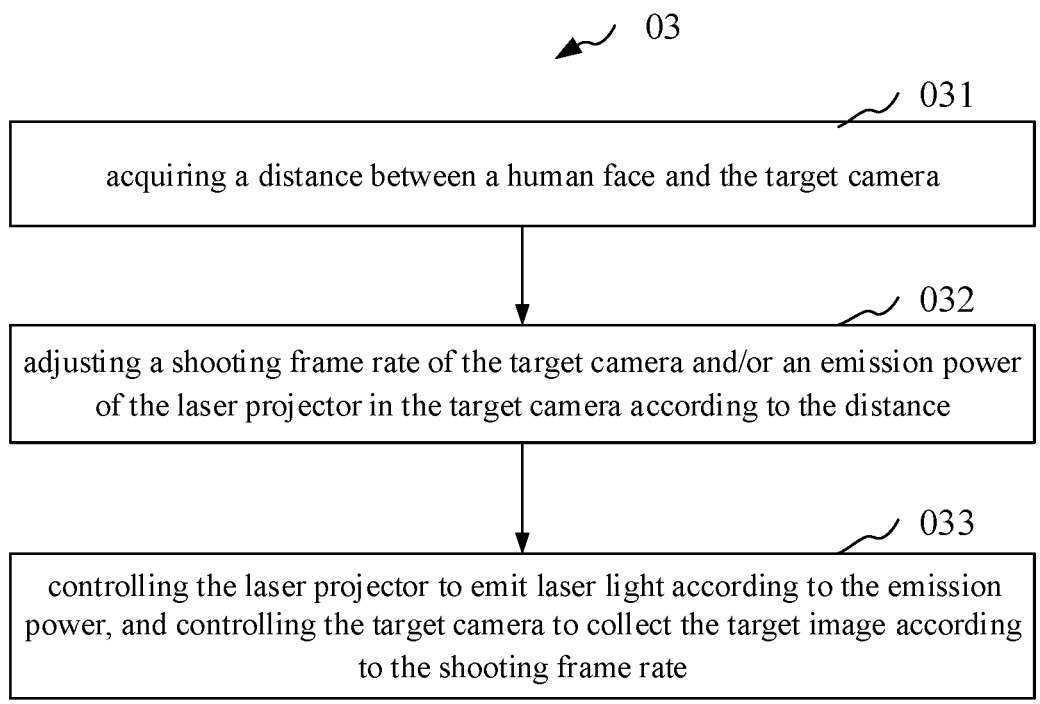

As illustrated in FIG. 9, in an embodiment, at block 03, a method for collecting the target image by the target camera, includes the following operations.

At block 031, a distance between a human face and the target camera is acquired.

At block 032, a shooting frame rate of the target camera and/or an emission power of the laser module in the target camera may be adjusted according to the distance.

At block 033, the laser module is controlled to emit laser light according to the emission power, and the target camera is controlled to collect the target image according to the shooting frame rate.

The electronic device 100 controls the target camera to be turned on, and controls the laser device to be turn on to emit laser light, so that the target image may collected by the target camera. When the distance between the human face and the target camera is too close, the laser light emitted by the laser device may cause certain damage to the human eyes. The closer the distance, the greater the damage caused to the human face. When the target camera is in the on state, the electronic device 100 may acquire the distance between the human face and the target camera every preset period of time. The period of time for collection may be set according to practical requirements, for example, 30 milliseconds, 1 second. The distance between the human face and the target camera may also be understood as the distance between the human face and the electronic device 100, or the distance between the human face and the laser device. Alternatively, a distance sensor may be disposed on the electronic device 100, and the distance between the human face and the target camera is collected by the distance sensor. It may be understood that the electronic device 100 may also acquire the distance between the human face and the target camera in other manners, which is not limited to the above manner.

The electronic device 100 may adjust the shooting frame rate of the target camera and/or the emission power of the laser device according to the distance between the human face and the target camera. When the distance between the human face and the target camera is too small, the shooting frame rate of the target camera and/or the emission power of the laser device may be reduced. Reducing the shooting frame rate of the target camera may reduce the number of times the laser device emits laser light within a certain time interval, and reducing the emission power of the laser device may reduce the intensity of the laser light emitted by the laser device, thereby reducing the harm of the laser light emitted by the laser device to the human eyes. The smaller the distance between the human face and the target camera, the smaller the shooting frame rate of the target camera and/or the smaller the emission power of the laser device.

After the electronic device 100 adjusts the shooting frame rate of the target camera and/or the emission power of the laser device according to the distance between the human face and the target camera, the laser device may be controlled to emit laser light according to the adjusted emission power, and the target camera is controlled to collect the target image according to the shooting frame rate.

In the method of the embodiments of the present disclosure, when the target camera is in use, the shooting frame rate of the target camera and/or the emission power of the laser device may be dynamically adjusted according to the distance between the human face and the target camera, which may reduce the damage caused by the laser light emitted by the laser device to the human eyes and protect the human eyes.

Figure 10:
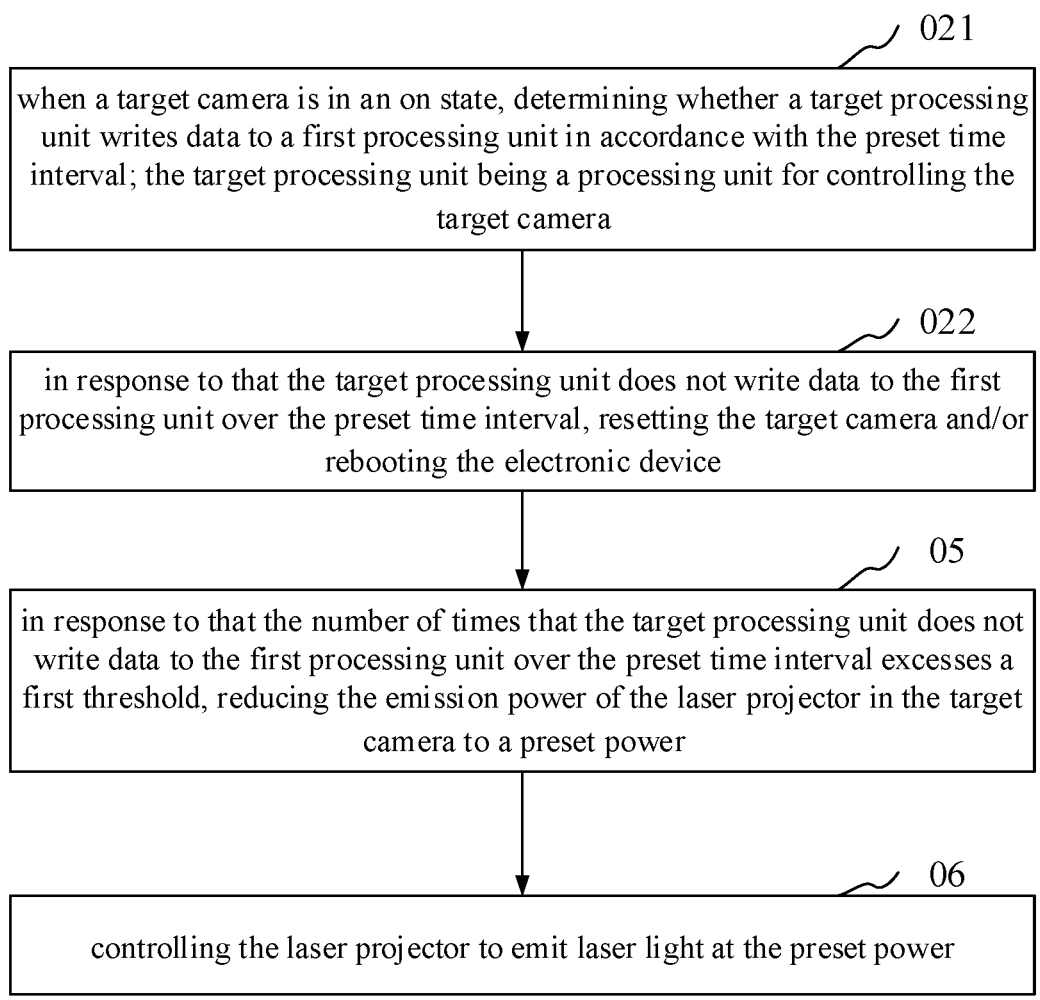

As illustrated in FIG. 10, in an embodiment, the foregoing method further includes the following operations.

At block 05, in response to that the number of times that the target processing unit 301 does not write data to the first processing unit 302 over the preset time interval excesses a first threshold, the emission power of the laser module in the target camera is reduced to a preset power.

At block 06, the laser module is controlled to emit laser light at the preset power.

The electronic device 100 may accumulate the number of times that the target processing unit 301 does not write data to the first processing unit 302 over the preset time interval, that is, the electronic device 100 may accumulate the number of times that the abnormality of the target processing unit 301 occurs. In response to that the number of times exceeds the first threshold, the electronic device 100 may adjust the emission power of the laser module in the target camera to reduce the emission power to the preset power. The preset power is less than the rated power of the laser module. For example, the preset power may be 50% of the rated power, or the preset power may be 40% of the rated power, which is not limited thereto. The electronic device 100 may control the laser module in the target camera to emit laser light according to the preset power, thereby acquiring the target image. The first threshold may be a value set by a user or a value set by the electronic device 100.

In the embodiments of the present disclosure, in response to that the electronic device 100 detects that the number of abnormalities of the target processing unit 301 exceeds the first threshold, the emission power of the laser module may be reduced, avoiding damaging the human eyes because the laser module illuminates the human eyes with the high-intensity light for the long period of time due to the abnormality of the target processing unit 301.

In an embodiment, the method for controlling an electronic device 100 includes the following operations.

(1) When a target camera is in an on state, it is determined whether a target processing unit 301 writes data to a first processing unit 302 in accordance with the preset time interval; the target processing unit 301 is a processing unit for controlling the target camera.

(2) In response to that the target processing unit 301 does not write data to the first processing unit 302 over the preset time interval, the target camera is controlled to reset and/or the electronic device 100 is controlled to reboot.

In an embodiment, the target camera is controlled to reset, which includes: disconnecting the circuit connection between the first processing unit 302 and the laser module in the target camera to turn off the laser module.

In an embodiment, the target processing unit 301 includes a first target processing unit and a second target processing unit, coupled in parallel to the first processing unit 302. It is determined whether the target processing unit 301 writes data to the first processing unit in accordance with the preset time interval, which includes: acquiring a preset first time interval corresponding to the first target processing unit and a preset second time interval corresponding to the second target processing unit; determining whether the first target processing unit writes data to the first processing unit in accordance with the preset first time interval, and whether the second target processing unit writes data to the first processing unit in accordance with the preset second time interval.

In an embodiment, the target processing unit 301 does not write data to the first processing unit 302 over the preset time interval, which includes that: the first target processing unit does not write data to the first processing unit 302 over the preset first time interval and/or the second target processing unit does not write data to the first processing unit 302 over the preset second time interval.

In an embodiment, after controlling the target camera to reset and/or controlling the electronic device 100 to reboot, the method further includes: acquiring a target image collected by the target camera when the target camera is in the on state; detecting the target image; and determining whether the target camera is abnormal, according to a detection result.

In an embodiment, a method for collecting the target camera by the target image includes: acquiring a distance between a human face and the target camera; adjusting a shooting frame rate of the target camera and/or an emission power of the laser module in the target camera according to the distance; controlling the laser module to emit laser light at the emission power, and controlling the target camera to collect the target image at the shooting frame rate.

In an embodiment, the method further includes: in response to that the number of times that the target processing unit 301 does not write data to the first processing unit 302 over the preset time interval excesses a first threshold, reducing the emission power of the laser module in the target camera to a preset power; and controlling the laser module to emit laser light at the preset power.

It should be understood that although the various acts in the above-described flowcharts are sequentially displayed as indicated by the arrows, these acts are not necessarily performed in the order indicated by the arrows. Except as explicitly stated herein, the execution of these acts is not strictly limited, and the acts may be performed in other orders. Moreover, at least some of the acts in the above flow chart may include a plurality of sub-acts or stages, which are not necessarily performed at the same time, but may be executed at different times, and these sub-acts or stages are not necessarily performed sequentially, but may be performed alternately with at least a portion of other acts or sub-acts or stages of other acts.

Figure 11:
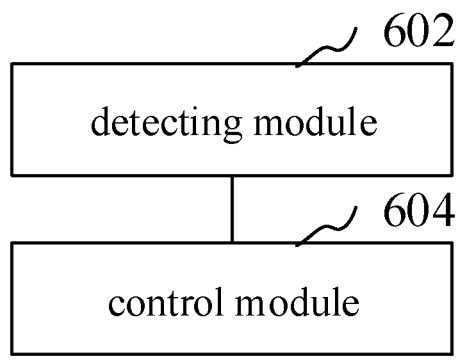
FIGS. 11-13 are block diagram of a device for controlling a camera component according to embodiments of the present disclosure.

FIG. 11 is a block diagram of a device 200 for controlling an electronic device 100 (or a device for controlling a camera component) in an embodiment. As illustrated in FIG. 11, a device 200 for controlling an electronic device 100, includes a detecting module 602 and a control module 604.

The detecting module 602 is configured to: when a target camera is in an on state, determine whether a target processing unit 301 writes data to a first processing unit 302 in accordance with a preset time interval. The target processing unit 301 is a processing unit for controlling the target camera.

The control module 604 is configured to: in response to that the target processing unit 301 does not write data to the first processing unit 302 over the preset time interval, control the target camera to reset and/or control the electronic device 100 to reboot.

In an embodiment, the control module 604 is configured to control the target camera to reset by an act of: disconnecting the circuit connection between the first processing unit 302 and the laser module in the target camera to turn off the laser module.

In an embodiment, the target processing unit 301 includes a first target processing unit and a second target processing unit, coupled in parallel to the first processing unit 302. The detecting module 602 is configured to determine whether the target processing unit 301 writes data to the first processing unit 302 in accordance with the preset time interval, by acts of: acquiring a preset first time interval corresponding to the first target processing unit and a preset second time interval corresponding to the second target processing unit; determining whether the first target processing unit writes data to the first processing unit 302 in accordance with the preset first time interval, and whether the second target processing unit writes data to the first processing unit in accordance with the preset second time interval.

In an embodiment, the target processing unit 301 does not write data to the first processing unit 302 over the preset time interval, which may include that: the first target processing unit does not write data to the first processing unit 302 over the preset first time interval, and/or the second target processing unit does not write data to the first processing unit 302 over the preset second time interval.

Figure 12:
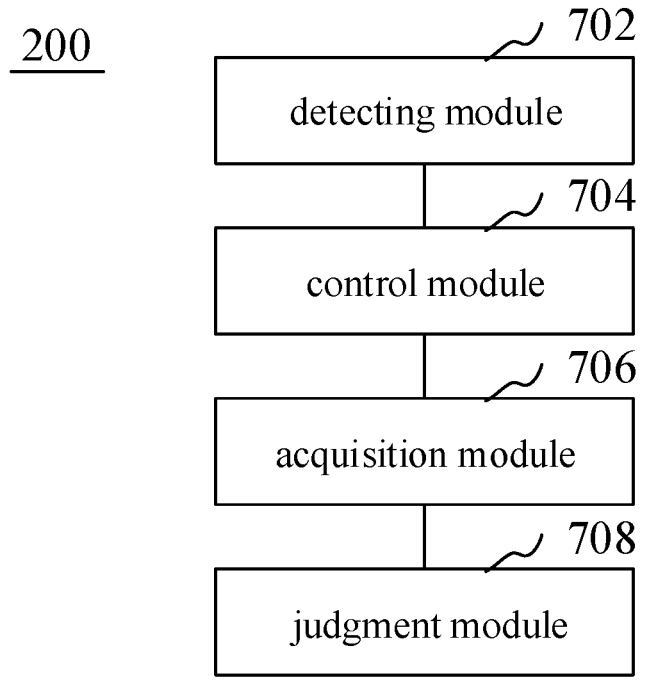

FIG. 12 is a block diagram of a device 200 for controlling an electronic device 100 in an embodiment. As illustrated in FIG. 12, a device 200 for controlling an electronic device 100, includes: a detecting module 702, a control module 704, an acquisition module 706, and a judgment module 708. The detecting module 702 and the control module 704 have the same functions as the corresponding modules in FIG. 11.

The acquisition module 706 is configured to acquire a target image collected by the target camera when the target camera is in the on state.

The judgment module 708 is configured to detect the target image, and determine whether the target camera is abnormal according to a detection result.

In an embodiment, a method for collecting the target image by the target camera includes: acquiring a distance between a human face and the target camera; adjusting a shooting frame rate of the target camera and/or an emission power of the laser module in the target camera according to the distance; controlling the laser module to emit laser light at the emission power, and controlling the target camera to collect the target image at the shooting frame rate.

Figure 13:
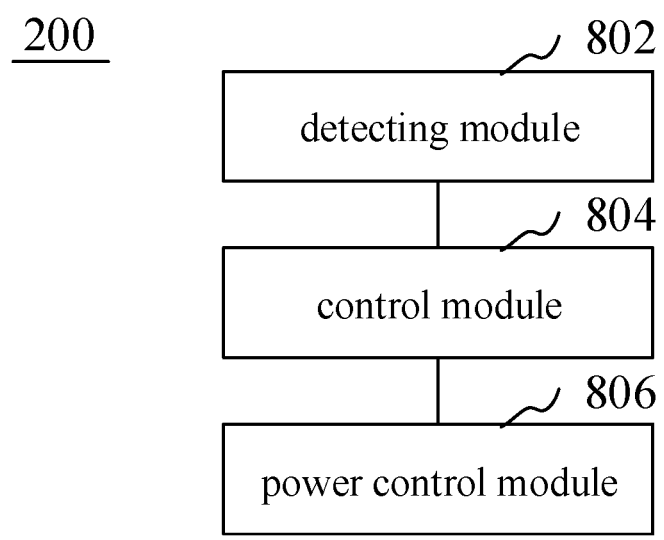

FIG. 13 is a block diagram of a device 200 for controlling an electronic device 100 in an embodiment. As illustrated in FIG. 12, a device 200 for controlling an electronic device 100, includes: a detecting module 802, a control module 804, and a power control module 806. The detecting module 802 and the control module 804 have the same functions as the corresponding modules in FIG. 11.

The power control module 806 is configured to: in response to that the number of times that the target processing unit 301 does not write data to the first processing unit 302 over the preset time interval exceeds a first threshold, reduce the emission power of the laser module in the target camera to a preset value; control the laser module to emit laser light at the preset power.

The division of each module in the device 200 for controlling the electronic device 100 is for illustrative purposes only. In other embodiments, the device 200 for controlling the electronic device 100 may be divided into different modules as needed to complete all or some of the functions of the device for controlling the electronic device 100.

The implementation of each module of the device for controlling the electronic device 100 provided in the embodiments of the present disclosure may be in the form of a computer program. The computer program may run on a terminal or a server. The program modules of the computer program may be stored on a memory of the terminal or the server. When the computer program is executed by a processor, the acts of the method described in the embodiments of the present disclosure are implemented.

The embodiments of the present disclosure further provide an electronic device 100. The electronic device 100 includes: a first processing unit 302, a target processing unit 301, and a camera component. The camera component includes a target camera and a laser module. The first processing unit 302 is coupled to the target processing unit 301 and the camera component.

The first processing unit 302 is configured to: when the target camera is in an on state, determine whether the target processing unit 301 writes data to the first processing unit 302 in accordance with the preset time interval. The target processing unit 301 may be a processing unit configured to control the target camera.

The first processing unit 302 is further configured to: in response to that the target processing unit 301 does not write data to the first processing unit 302 over the preset time interval, control the target camera to reset and/or control the electronic device 100 to reboot.

In an embodiment, the first processing unit 302 is configured to control the target camera to reset by an act of: disconnecting the circuit connection between the first processing unit 302 and the laser module in the target camera to turn off the laser module.

In an embodiment, the target processing unit 301 includes a first target processing unit and a second target processing unit, coupled in parallel to the first processing unit 302. The first processing unit 302 is configured to determine whether the target processing unit 301 writes data to the first processing unit 302 in accordance with the preset time interval by acts of: acquiring a preset first time interval corresponding to the first target processing unit and a preset second time interval corresponding to the second target processing unit; determining whether the first target processing unit writes data to the first processing unit 302 in accordance with the preset first time interval, and whether the second target processing unit writes data to the first processing unit in accordance with the preset second time interval.

In an embodiment, the target processing unit 301 does not write data to the first processing unit 302 over the preset time interval may include that: the first target processing unit does not write data to the first processing unit 302 over the preset first time interval and/or the second target processing unit does not write data to the first processing unit 302 over the preset second time interval.

In an embodiment, the electronic device 100 further includes a second processing unit. The second processing unit may be a CPU core or the like in the electronic device 100. The second processing unit is configured to, after the target camera is controlled to reset and/or the electronic device 100 is controlled to reboot, acquire a target image collected by the target camera when the target camera is in the on state; and detect the target image, and determine whether the target camera is abnormal according to a detection result.

In an embodiment, a method for collecting the target image by the target camera includes: acquiring a distance between a human face and the target camera; adjusting a shooting frame rate of the target camera and/or an emission power of the laser module in the target camera according to the distance; controlling the laser module to emit laser light at the emission power, and controlling the target camera to collect the target image at the shooting frame rate.

In an embodiment, the electronic device 100 further includes a second processing unit. The second processing unit is configured to: in response to that the number of times that the target processing unit 301 does not write data to the first processing unit 302 over the preset time interval excesses a first threshold, reduce the emission power of the laser module in the target camera a preset power; control the laser module to emit laser light at the preset power.

Figure 14:
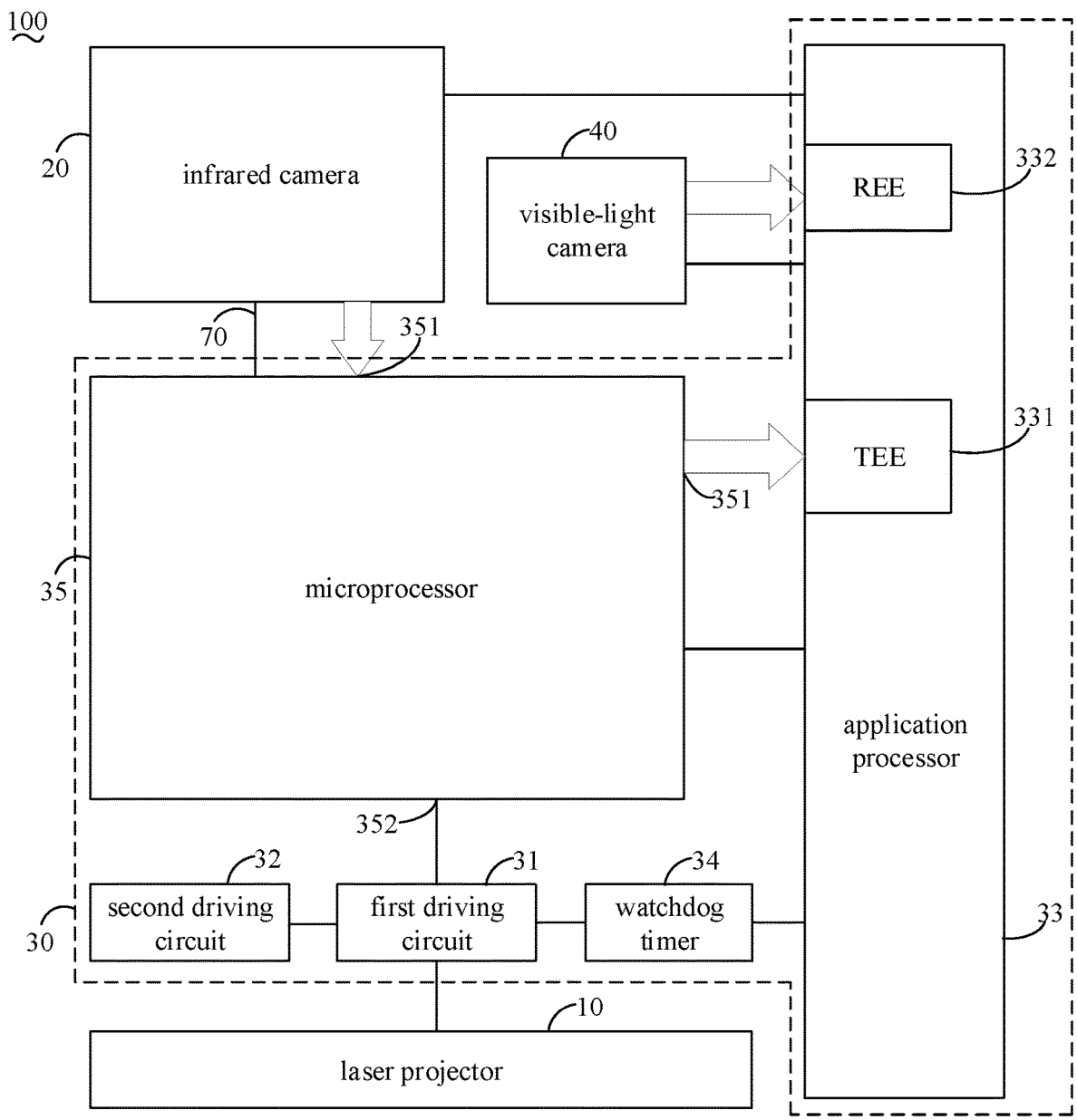
FIGS. 14-19 are block diagram of an electronic device according to embodiments of the present disclosure.

As illustrated in FIGS. 1 and 14, an electronic device 100 includes a camera component 80 and a control system 30. The camera component 80 includes a laser projector 10 and an infrared camera 20. The electronic device 100 may be a mobile phone, a tablet computer, a smart watch, a smart wristband, a smart wearable device and the like. In the embodiments of the present disclosure, the electronic device 100 is taken as a mobile phone as an example for illustration. It may be understood that the specific form of the electronic device 100 is not limited to mobile phones. The above data includes a predetermined signal.

The laser projector 10 is capable of projecting laser light onto a target object, and the laser light may be infrared light, while the laser light projected by the laser projector 10 may be a pattern with specific speckle(s) or streak(s). The infrared camera 20 is capable of collecting an infrared image of the target object or receiving a laser pattern modulated by the target object. In order to acquire a clear laser pattern, generally, it is necessary to continuously emit a plurality of frames of laser light to the target object at a certain optical power. However, if the laser projector 10 continuously emits laser light, the laser light may damage the user, especially user's eyes. Therefore, it is necessary to prevent the laser projector 10 from continuously emitting laser light.

The control system 30 includes a first processing unit 302 and a target processing unit 301. The target processing unit 301 includes a first driving circuit 31, a second driving circuit 32, an AP (application processor) 33 and a microprocessor 35. The first processing unit 302 includes a watchdog timer 34.

The first driving circuit 31 is coupled to the laser projector 10. The first driving circuit 31 is configured to drive the laser projector 10 to project laser light. The second driving circuit 32 is coupled to the first driving circuit 31. The second driving circuit 32 is configured to power the first driving circuit 31, for example, the first driving circuit 31 may be a DC/DC circuit. It may be understood that the first driving circuit 31 serves as a current source of the laser projector 10. If the first driving circuit 31 is turned off, the laser projector 10 cannot emit laser light. If the second driving circuit 32 is turned off, both the first driving circuit 31 and the laser projector 10 are turned off, and the laser projector 10 cannot emit laser light. If the first driving circuit 31 and the second driving circuit 32 are turned off, both the first driving circuit 31 and the laser projector 10 are turned off, and the laser projector 10 cannot emit laser light. The first driving circuit 31 may be separately packaged as a driving chip, and the second driving circuit 32 may be separately packaged as a driving chip, or the first driving circuit 31 and the second driving circuit 32 may be packaged together in one driving chip. The driving chip may be disposed on a substrate or a circuit board of the laser projector 10.

The application processor 33 may be a system of the electronic device 100. The application processor 33 may be coupled to the first driving circuit 31. The application processor 33 may also be coupled to the infrared camera 20. The application processor 33 may also be coupled to a plurality of electronic components of the electronic device 100 and control the plurality of electronic components to operate in predetermined modes, for example, control a display screen of the electronic device 100 to display a predetermined picture, control an antenna of the electronic device 100 to transmit or receive predetermined data, control a visible-light camera 40 of the electronic device 100 to acquire a color image and process the color image, control a power supply of the infrared camera 20 to turn on/off, and turn off (pwdn) the infrared camera 20 or reset the infrared camera 20.

The application processor 33 is further configured to control the first driving circuit 31 to operate to drive the laser projector 10 to project laser light. In detail, the application processor 33 is configured to control the current of the first driving circuit 31. It may be understood that when the application processor 33 is malfunctioning, for example, when the application processor 33 is down, the first driving circuit 31 may be in a state of continuously driving the laser projector 10 to emit laser light, and continuously emitting the laser light is of high risk. Therefore, it is necessary to monitor the operating state of the application processor 33, and when the application processor 33 is malfunctioning, the laser projector 10 is turned off in time. In the embodiments of the present disclosure, the laser projector 10 may be turned off by turning off the first driving circuit 31. The laser projector 10 may be turned off by turning off the second driving circuit 32. The laser projector 10 may also be turned off by simultaneously turning off the first driving circuit 31 and the second driving circuit 32.

In order to monitor the operating state of the application processor 33, the application processor 33 may transmit a predetermined signal to the watchdog timer 34 within the preset second time interval, such as transmitting a clear signal to the watchdog timer 34 every 50 milliseconds. When the application processor 33 is malfunctioning, the application processor 33 cannot run the program for transmitting the predetermined signal to the watchdog timer 34, so that the predetermined signal cannot be transmitted and the failure state of the application processor 33 is detected.

As illustrated in FIG. 14, the watchdog timer 34 is coupled to the first driving circuit 31, and the watchdog timer 34 is coupled to the application processor 33. The watchdog timer 34 is configured to turn off the first driving circuit 31 to turn off the laser projector 10, if not receiving the predetermined signal within the preset time interval.

Figure 15:
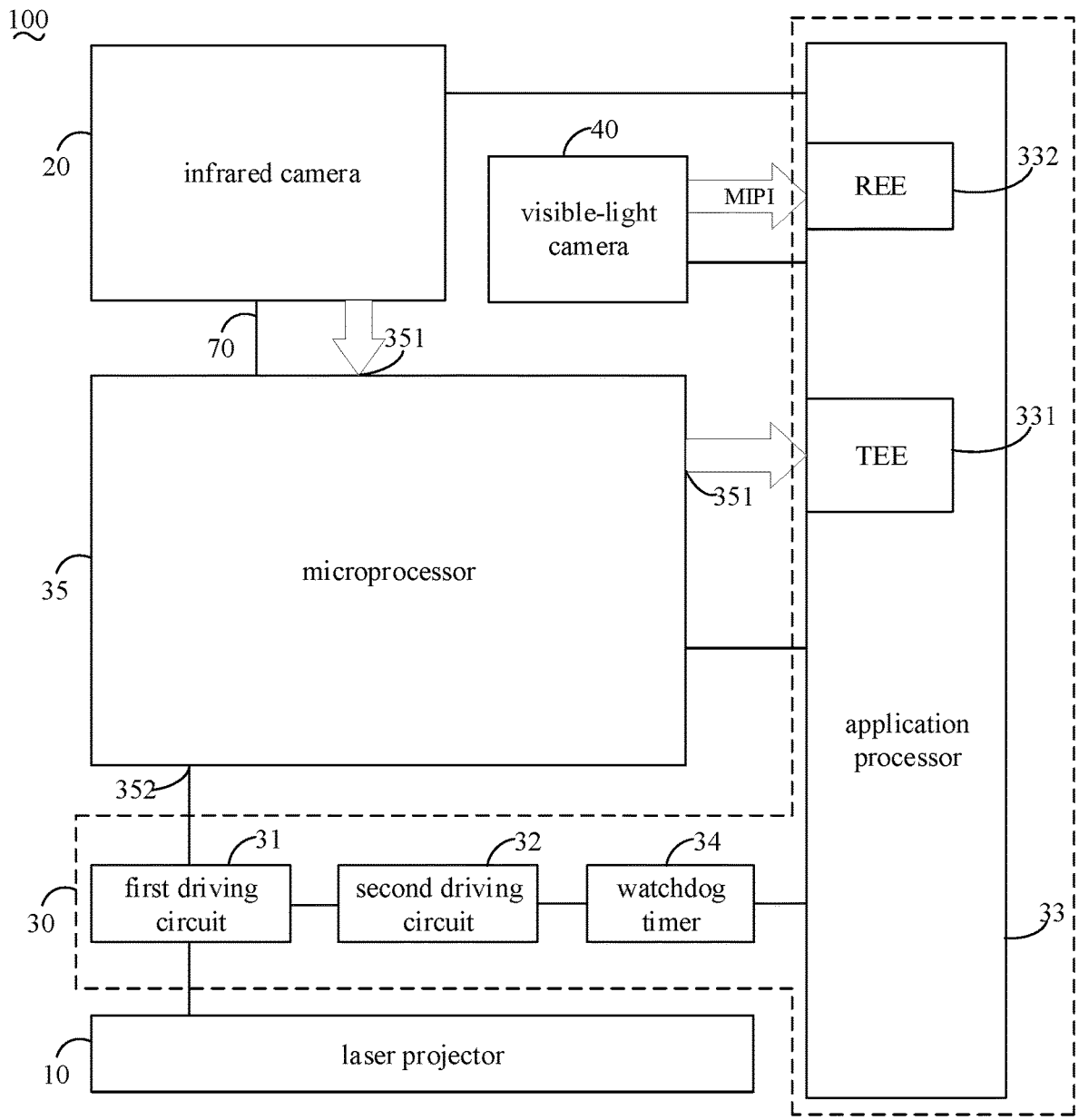

As illustrated in FIG. 15, the watchdog timer 34 is coupled to the second driving circuit 32, and the watchdog timer 34 is coupled to the application processor 33. The watchdog timer 34 is configured to turn off the second driving circuit 32 to turn off the laser projector 10, if not receiving the predetermined signal within the preset time interval.

Figure 16:
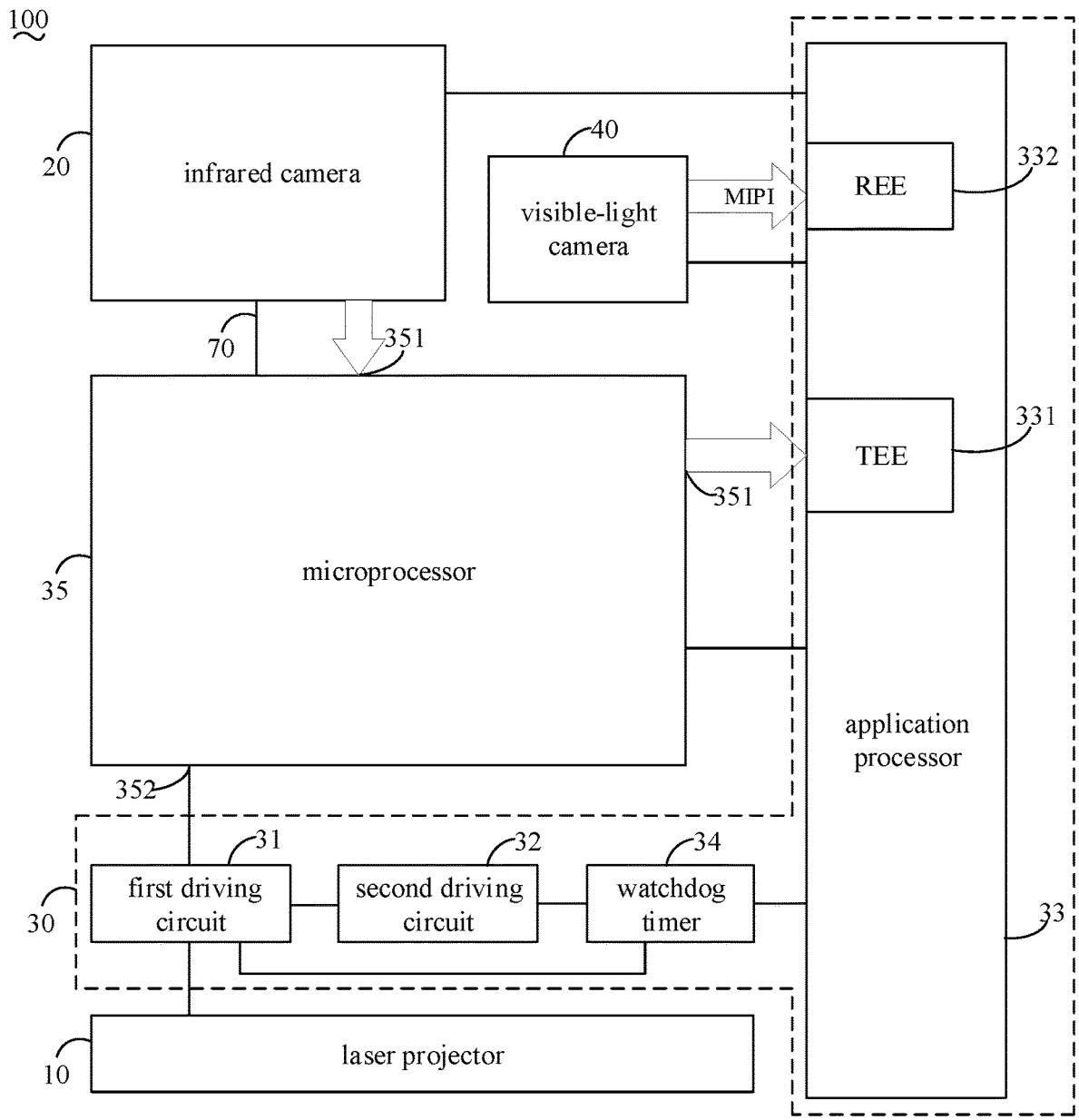

As illustrated in FIG. 16, the watchdog timer 34 is coupled to the first driving circuit 31 and the second driving circuit 32, and the watchdog timer 34 is coupled to the application processor 33. The watchdog timer 34 is configured to turn off the first driving circuit 31 and the second driving circuit 32 to turn off the laser projector 10, if not receiving the predetermined signal within the preset time interval. In this case, even if one of the first driving circuit 31 and the second driving circuit 32 is malfunctioning and cannot be directly turned off, the watchdog timer 34 turns off the first driving circuit 31 and the second driving circuit 32, thereby ensuring that one of the first driving circuit 31 and the second driving circuit 32 that operates normally is turned off at least to smoothly turn off the laser projector 10.

The preset time interval may be set when the electronic device 100 is at the factory, or may be customized by the user on the electronic device 100.

In detail, in the embodiments of the present disclosure, the specific form of the watchdog timer 34 may be a counter. After the watchdog timer 34 receives the predetermined signal, the watchdog timer 34 starts counting down from a number at a certain speed. If the application processor 33 is operating normally, the application processor 33 will retransmit the predetermined signal again before the countdown reaches 0, thus the watchdog timer 34 resets the countdown after receiving the predetermined signal; if the application processor 33 does not operate normally, in response to that the watchdog timer 34 counts to 0, the watchdog timer 34 is deemed to determine that the application processor 33 is malfunctioning, at which time the watchdog timer 34 transmit signals to turn off the first driving circuit 31 to further turn off the laser projector 10.

In an example, the watchdog timer 34 may be disposed outside of the application processor 33. The watchdog timer 34 may be an external timer chip. The watchdog timer 34 may be coupled to an I/O pin of the application processor 33, to receive the predetermined signal transmitted by the application processor 33. The reliability of the external watchdog timer 34 is high. In another example, the watchdog timer 34 may be integrated within the application processor 33, and the functionality of the watchdog timer 34 may be implemented by the internal timer of the application processor 33, which simplifies the hardware circuit design of the control system 30.

The microprocessor 35 may be a processing chip, and the microprocessor 35 is coupled to the application processor 33, the first driving circuit 31, and the infrared camera 20.

The microprocessor 35 is coupled to the application processor 33 to enable the application processor 33 to reset the microprocessor 35, wake the microprocessor 35, and debug the microprocessor 35. The microprocessor 35 is coupled to the application processor 33 through a MIPI (Mobile Industry Processor Interface) 351. In detail, the microprocessor 35 is coupled to the TEE 331 of the application processor 33 through the MIPI to directly transmit the data in the microprocessor 35 to the TEE 331. The code and the memory area in the TEE 331 are both controlled by the access control unit and cannot be accessed by the program in the REE 332. The TEE 331 and REE 332 may be formed in the application processor 33.

The microprocessor 35 may be coupled to the first driving circuit 31 through a PWM (Pulse Width Modulation) 352. The microprocessor 35 may also be configured to control the first driving circuit 31 to drive the laser projector 10 to project laser light. In detail, the microprocessor 35 is configured to control the driving frequency of the first driving circuit 31. The microprocessor 35 and the infrared camera 20 may be connected by an I2C (Inter-Integrated Circuit) bus 70. The microprocessor 35 may provide the infrared camera 20 with clock information for collecting infrared images and laser patterns, and infrared images and laser patterns collected by the infrared camera 20 may be transmitted to the microprocessor 35 via the MIPI 351.

In an embodiment, the infrared template and the depth template for verifying the identity may be stored in the TEE 331. The infrared template may be a face infrared image input by the user in advance, and the depth template may be a face depth image input by the user in advance. The infrared template and the depth template are stored in the TEE 331, and are not easily falsified and stolen, thus the information in the electronic device 100 is highly secured.

When the user needs to verify the identity, the microprocessor 35 controls the infrared camera 20 to collect the infrared image of the user, and then transmits it to the TEE 331 of the application processor 33. The application processor 33 compares the infrared image with the infrared template in the TEE 331. If the infrared image matches the infrared template, the verification result that the infrared template verification is passed is output. In the process of matching and comparing, the infrared image and the infrared template are not acquired, falsified or stolen by other programs, thereby improving the information security of the electronic device 100.

Further, the microprocessor 35 may control the first driving circuit 31 to drive the laser projector 10 to project laser light, and control the infrared camera 20 to collect the laser pattern modulated by the target object, and the microprocessor 35 acquires and processes the laser pattern to acquire the depth image. The depth image is transmitted to the TEE 331 of the application processor 33. The application processor 33 compares the depth image with the depth template in the TEE 331. If the depth image matches the depth template, the verification result that the depth template verification is passed is output. In the process of matching and comparing, the depth image and the depth template are not acquired, falsified or stolen by other programs, thereby improving the information security of the electronic device 100.

In conclusion, in the electronic device 100 of the embodiments of the present disclosure, in response to that the watchdog timer 34 has not received the predetermined signal within the preset time interval, it is determined that the application processor 33 is malfunctioning, and the laser projector 10 may emit the laser light for the long period of time. In this case, the watchdog timer 34 turns off the first driving circuit 31 to turn off the laser projector 10, or the watchdog timer 34 turns off the second driving circuit 32 to turn off the laser projector 10, or the watchdog timer 34 turns off the first driving circuit 31 and the second driving circuit 32 to turn off the laser projector 10, to prevent the laser projector 10 from continuously emitting laser light and endangering the user.

As illustrated in FIGS. 14 to 16, in some embodiments, the watchdog timer 34 is further configured to issue a reset signal for rebooting the application processor 33 in response to that the predetermined signal is not received within the preset time interval. As described above, in response to that the watchdog timer 34 has not received the predetermined signal within the preset time interval, the application processor 33 is malfunctioning, and at this time, the watchdog timer 34 issues the reset signal to cause the application processor 33 to reset and operate normally.

In detail, in an example, the reset signal may be directly received by the application processor 33. The reset signal has a higher level in the execution programs of the application processor 33, and the application processor 33 may preferentially respond to the reset signal and reset. In another example, the reset signal may also be transmitted to a reset chip disposed externally on the application processor 33, which forces the application processor 33 to reset in response to the reset signal.

In some embodiments, the preset time interval is selected from a range of [50, 150]milliseconds. In detail, the preset time interval may be set to 50 milliseconds, 62 milliseconds, 75 milliseconds, 97 milliseconds, 125 milliseconds, 150 milliseconds, and any time interval within the above range. It may be understood that if the preset time interval is set too short, the application processor 33 is required to transmit the predetermined signal too frequently, which may occupy too much processing space of the application processor 33 and cause the electronic device 100 to be easily jammed. If the preset time interval is set too long, the malfunction of the application processor 33 cannot be detected in time, that is, the laser projector 10 cannot be turned off in time, which is disadvantageous for the safe use of the laser projector 10. By setting the preset time interval to be in [50, 150]milliseconds, it is possible to better balance the fluency and security of the electronic device 100.

Figure 17:
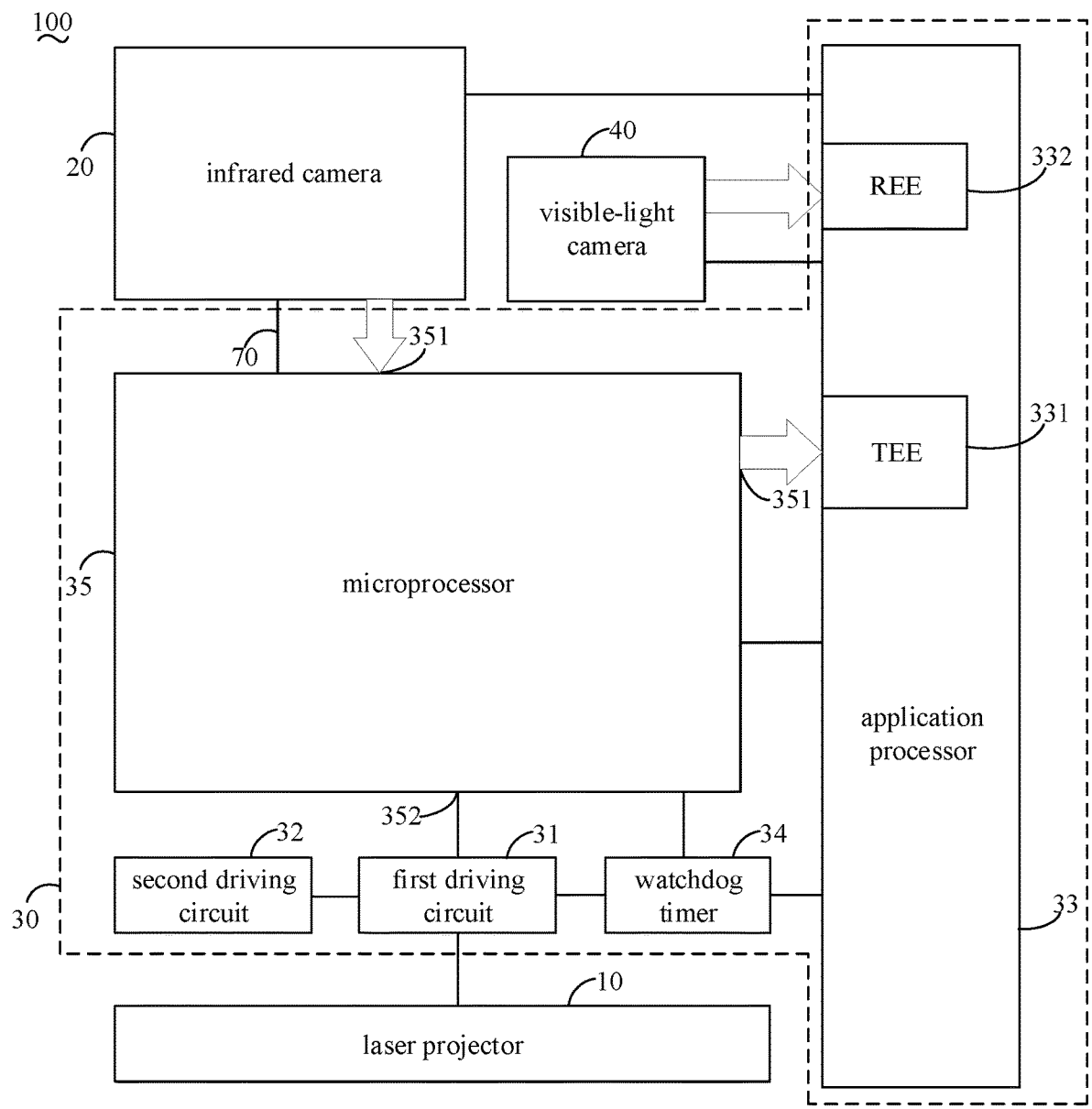
Figure 18:
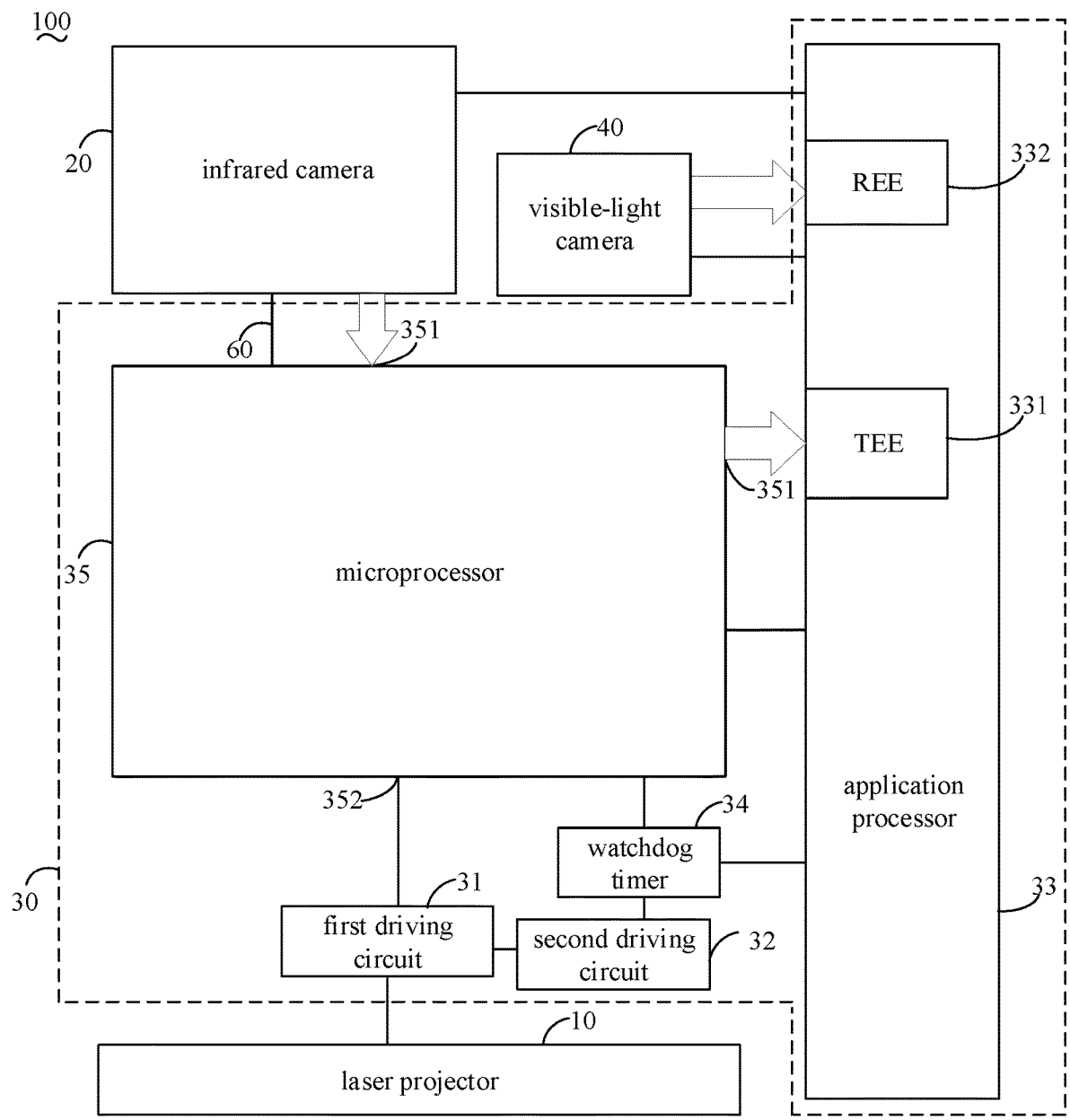
Figure 19:
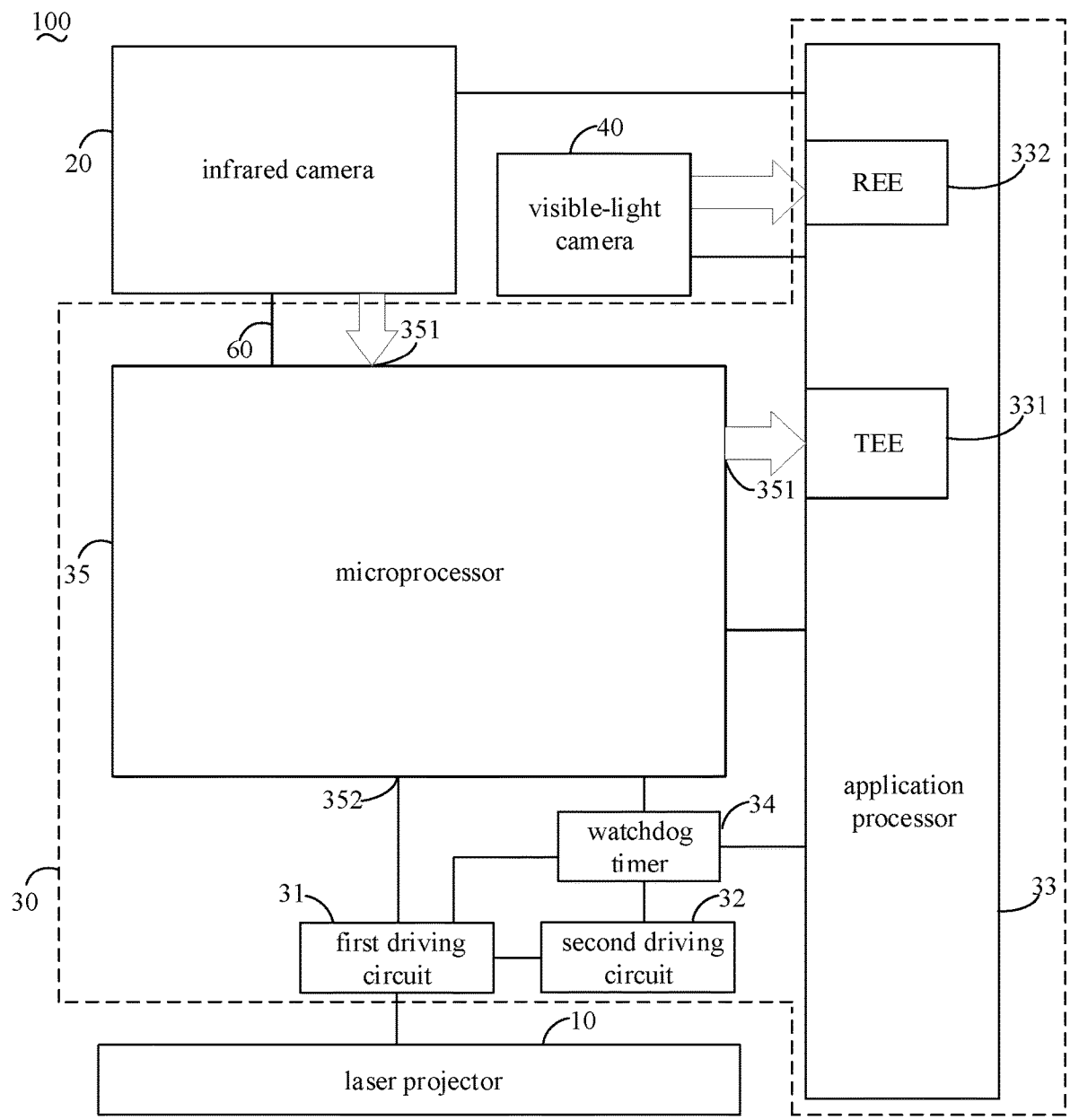

As illustrated in FIGS. 17 to 19, the microprocessor 35 is coupled to the watchdog timer 34 and may transmit the predetermined signal to the watchdog timer 34 within the preset time interval, which will be specifically illustrated as follows.

The microprocessor 35 is coupled to the first driving circuit 31 and is configured to control the first driving circuit 31 to drive the laser projector 10 to project laser light. It may be understood that when the microprocessor 35 is malfunctioning, for example, when the microprocessor 35 is down, the first driving circuit 31 may be in a state of continuously driving the laser projector 10 to emit laser light, and the laser light continuously emitted is of a high risk. Therefore, it is necessary to monitor the operating state of the microprocessor 35. When the microprocessor 35 is malfunctioning, the laser projector 10 is turned off in time. In the embodiments of the present disclosure, the laser projector 10 may be turned off by turning off the first driving circuit 31. The second driving circuit 32 may be turned off to stop powering the first driving circuit 31, such that the laser projector 10 is powered off. The first driving circuit 31 and the second driving circuit 32 may both be turned off, in order to turn off the laser projector 10.

In order to monitor the operating state of the microprocessor 35, the microprocessor 35 may transmit the predetermined signal to the watchdog timer 34 within the preset time interval, for example, transmit a clear signal to the watchdog timer 34 every 50 milliseconds. When the microprocessor 35 is malfunctioning, the microprocessor 35 cannot run the program for transmitting the predetermined signal to the watchdog timer 34, so that the predetermined signal cannot be transmitted, thus the malfunction of the microprocessor 35 is detected.

As illustrated in FIG. 17, the watchdog timer 34 is coupled to the first driving circuit 31, and the watchdog timer 34 is coupled to the microprocessor 35. The watchdog timer 34 is configured to turn off the first driving circuit 31 if the predetermined signal is not received within the preset time interval, to further turn off the laser projector 10.

As illustrated in FIG. 18, the watchdog timer 34 is coupled to the second driving circuit 32, and the watchdog timer 34 is coupled to the microprocessor 35. The watchdog timer 34 is configured to turn off the second driving circuit 32 if the predetermined signal is not received within the preset time interval, to further turn off the laser projector 10.

As illustrated in FIG. 19, the watchdog timer 34 is coupled to the first driving circuit 31, the second driving circuit 32, and the microprocessor 35. The watchdog timer 34 is configured to turn off the first driving circuit 31 and the second driving circuit 32 if the predetermined signal is not received within the preset time interval, to further turn off the laser projector 10. By turning off the first driving circuit 31 and the second driving circuit 32, even if one of the first driving circuit 31 and the second driving circuit 32 cannot be directly turned off due to malfunction, it is ensured at least that one of the first driving circuit 31 and the second that operates normally is turned off, so that the laser projector 10 may be smoothly turned off.

The preset time interval may be set when the electronic device 100 is at the factory, or may be customized by the user on the electronic device 100.

In detail, in the embodiments of the present disclosure, the specific form of the watchdog timer 34 may be a counter. After the watchdog timer 34 receives the predetermined signal, the watchdog timer 34 starts counting down from a number at a certain speed. If the microprocessor 35 is operating normally, the microprocessor 35 will retransmit the predetermined signal again before the countdown reaches 0, thus the watchdog timer 34 resets the countdown after receiving the predetermined signal; if the microprocessor 35 does not operate normally, in response to that the watchdog timer 34 counts to 0, the watchdog timer 34 is deemed to determine that the microprocessor 35 is malfunctioning, at which time the watchdog timer 34 transmit signals to turn off the first driving circuit 31 to further turn off the laser projector 10.

In an example, the watchdog timer 34 may be disposed outside of the microprocessor 35. The watchdog timer 34 may be an external timer chip. The watchdog timer 34 may be coupled to an I/O pin of the microprocessor 35, to receive the predetermined signal transmitted by the microprocessor 35. The reliability of the external watchdog timer 34 is high. In another example, the watchdog timer 34 may be integrated within the microprocessor 35, and the functionality of the watchdog timer 34 may be implemented by the internal timer of the microprocessor 35, which simplifies the hardware circuit design of the control system 30.

In conclusion, in the electronic device 100 of the embodiments of the present disclosure, in response to that the watchdog timer 34 has not received the predetermined signal transmitted by the microprocessor 35 within the preset time interval, it is determined that the microprocessor 35 is malfunctioning. In this case, the watchdog timer 34 turns off the first driving circuit 31 to turn off the laser projector 10, or the watchdog timer 34 turns off the second driving circuit 32 to turn off the laser projector 10, or the watchdog timer 34 turns off the first driving circuit 31 and the second driving circuit 32 to turn off the laser projector 10 to prevent the laser projector 10 from continuously emitting laser light and endangering the user.

As illustrated in FIGS. 17 to 19, in some embodiments, the watchdog timer 34 is further configured to issue a reset signal for resetting the microprocessor 35 in response to that the predetermined signal is not received within the preset time interval. As described above, in response to that the watchdog timer 34 has not received the predetermined signal within the preset time interval, the microprocessor 35 is malfunctioning, and at this time, the watchdog timer 34 issues the reset signal to cause the microprocessor 35 to reset and operate normally.

In detail, in an example, the reset signal may be directly received by the microprocessor 35. The reset signal has a higher level in the execution programs of the microprocessor 35, and the microprocessor 35 may preferentially respond to the reset signal and reset. In another example, the reset signal may also be transmitted to a reset chip disposed externally on the microprocessor 35, which forces the microprocessor 35 to reset in response to the reset signal.

As illustrated in FIGS. 17 to 19, in some embodiments, the application processor 33 is further coupled to the watchdog timer 34. The watchdog timer 34 is further configured to issue a reset signal in response to that the predetermined signal is not received within the preset time interval. The application processor 33 receives the reset signal and resets the microprocessor 35. As described above, if the watchdog timer 34 has not received the predetermined signal within the preset time interval, the microprocessor 35 is malfunctioning, and at this time, the watchdog timer 34 issues the reset signal to cause the microprocessor 35 to reset and operate normally. In detail, the reset signal is received by the application processor 33, which has a higher level in the execution programs of the application processor 33, and the application processor 33 may preferentially respond to the reset signal and reset the microprocessor 35.

In some embodiments, the preset time interval is selected from a range of [50, 150]milliseconds. In detail, the preset time interval may be set to 50 milliseconds, 62 milliseconds, 75 milliseconds, 97 milliseconds, 125 milliseconds, 150 milliseconds, and any time interval within the above range. It may be understood that if the preset time interval is set too short, the microprocessor 35 is required to transmit the predetermined signal too frequently, which may occupy too much processing space of the microprocessor 35 and cause the electronic device 100 to be easily jammed. If the preset time interval is set too long, the malfunction of the microprocessor 35 cannot be detected in time, that is, the laser projector 10 cannot be turned off in time, which is disadvantageous for the safe use of the laser projector 10. By setting the preset time interval to be in [50, 150]milliseconds, it is possible to better balance the fluency and security of the electronic device 100.

Figure 20:
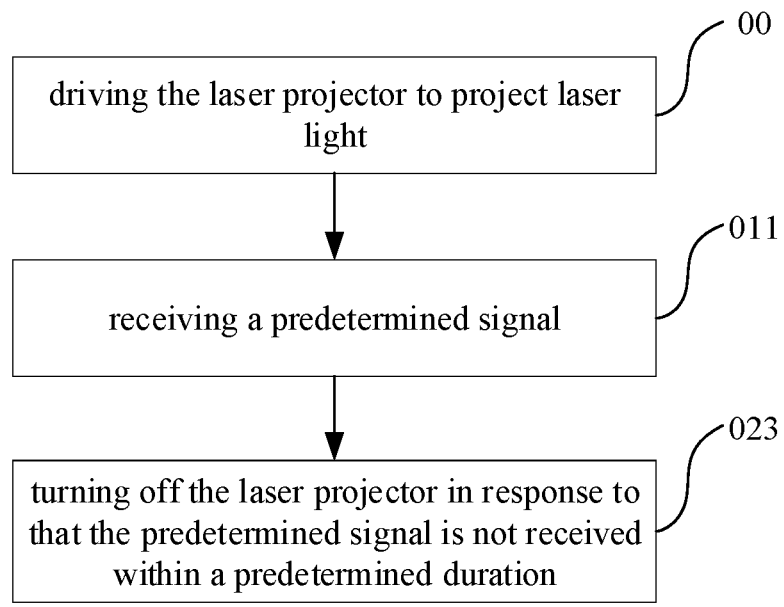
FIGS. 20-25 are flow charts of a method for controlling a camera component according to embodiments of the present disclosure.

As illustrated in FIG. 20, the method for controlling the camera component 80 according to the embodiments of the present disclosure includes the following operations. At block 00, the laser projector 10 is driven to project laser light.

The act at block 01 includes an act at block 011. At block 011, a predetermined signal is received.

The act at block 02 includes an act at block 023. At block 023, the laser projector 10 is turned off in response to that the predetermined signal is not received within the preset time interval.

In the method for controlling the camera component 80 illustrated in FIG. 20, if the predetermined signal is not received within the preset time interval, it is determined that the system of the electronic device 100 is malfunctioning, and the laser projector 10 is turned off to prevent the laser projector 10 from continuously emitting laser light and endangering the user. The implementation of the control method may be referred to the foregoing detailed description of the electronic device 100, and details are not described herein again.

Figure 21:
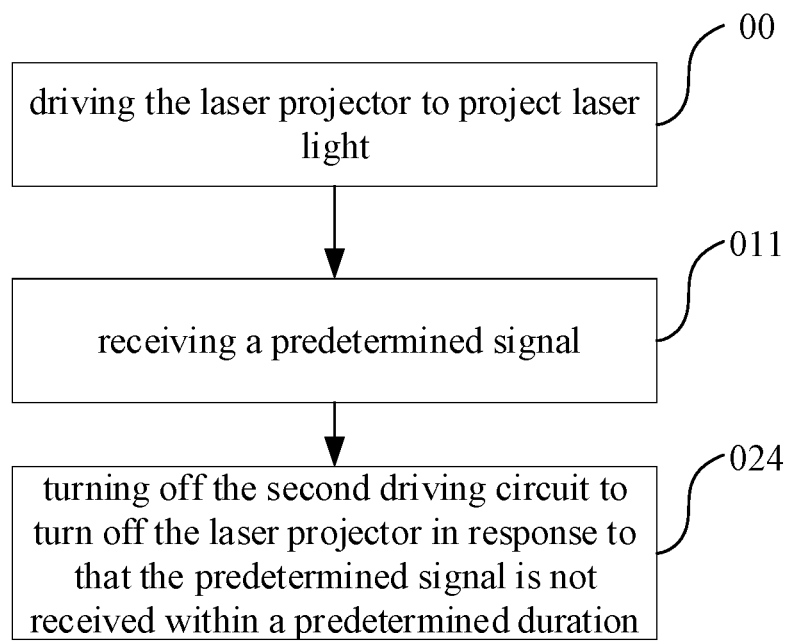

As illustrated in FIG. 21, the method for controlling the camera component 80 according to the embodiments of the present disclosure includes the following operations. At block 00, the laser projector 10 is driven to project laser light.

The act at block 01 includes an act at block 011. At block 011, a predetermined signal is received.

The act at block 02 includes an act at block 024. At block 024, the second driving circuit 32 is turned off to turn off the laser projector 10, in response to that the predetermined signal is not received within the preset time interval.

In the method for controlling the camera component 80 illustrated in FIG. 21, if the predetermined signal is not received within the preset time interval, it is determined that the system of the electronic device 100 is malfunctioning, and the second driving circuit 32 is turned off to turn off the laser projector 10 to prevent the laser projector 10 from continuously emitting laser light and endangering the user. The implementation of the control method may be referred to the foregoing detailed description of the electronic device 100, and details are not described herein again.

Figure 22:
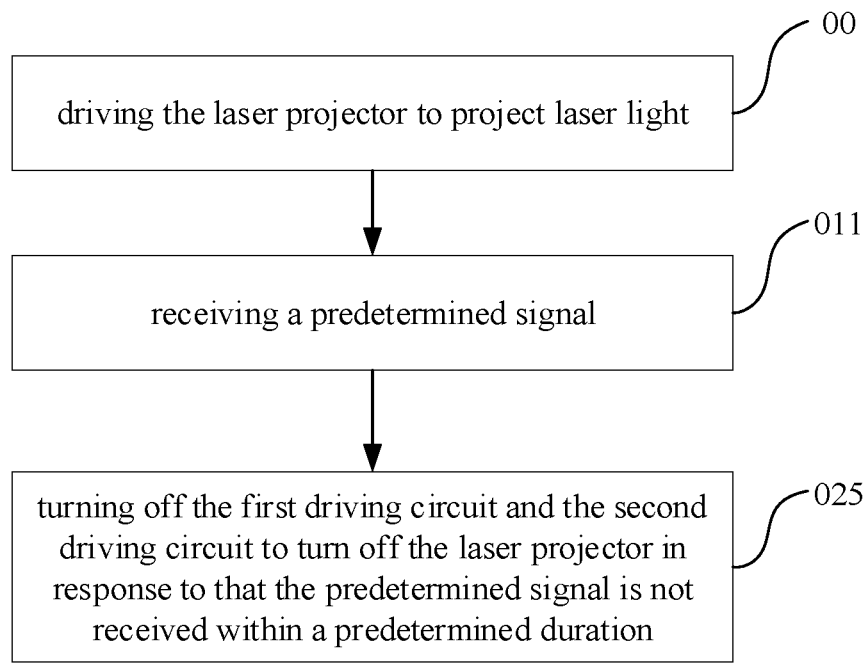

As illustrated in FIG. 22, the method for controlling the camera component 80 according to the embodiments of the present disclosure includes the following operations. At block 00, the laser projector 10 is driven to project laser light.

The act at block 01 includes an act at block 011. At block 011, a predetermined signal is received.

The act at block 02 includes an act at block 025. At block 025, the first driving circuit 31 and the second driving circuit 32 are turned off to turn off the laser projector 10, in response to that the predetermined signal is not received within the preset time interval.

In the method for controlling the camera component 80 illustrated in FIG. 22, if the predetermined signal is not received within the preset time interval, it is determined that the system of the electronic device 100 is malfunctioning, and the first driving circuit 31 and the second driving circuit 32 are turned off to turn off the laser projector 10 in order to prevent the laser projector 10 from continuously emitting laser light and endangering the user. The implementation of the control method may be referred to the foregoing detailed description of the electronic device 100, and details are not described herein again.

Figure 23:
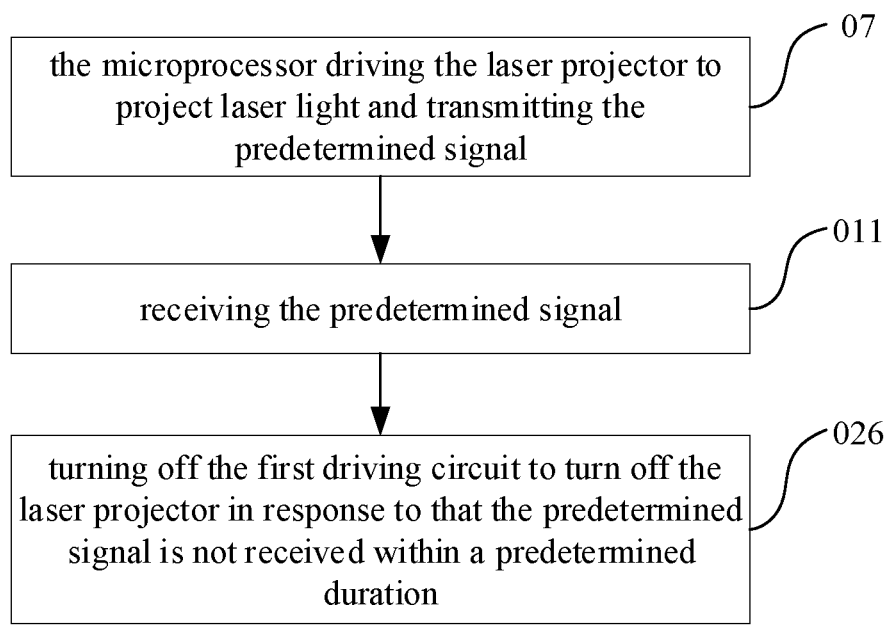

As illustrated in FIG. 23, the method for controlling the camera component 80 according to an embodiment of the present disclosure further includes an act at block 07. At block 07, the microprocessor 35 drives the laser projector 10 to project laser light and transmit a predetermined signal.

The act at block 01 includes an act at block 011. At block 011, the predetermined signal is received.

The act at block 02 includes the act at block 026. At block 026, the first driving circuit 31 is turned off to turn off the laser projector 10, in response to that the predetermined signal is not received within the preset time interval.

In the method for controlling the camera component 80 illustrated in FIG. 23, if the predetermined signal is not received within the preset time interval, it is determined that the microprocessor 35 is malfunctioning, and the laser projector 10 is turned off to prevent the laser projector 10 from continuously emitting laser light and endangering the user. The implementation of the control method may be referred to the foregoing detailed description of the electronic device 100, and details are not described herein again.

Figure 24:
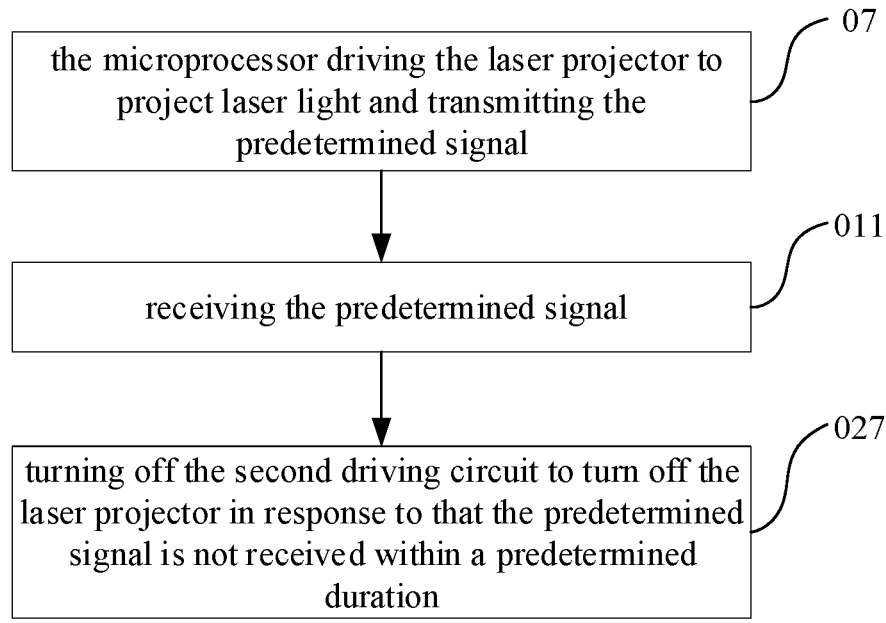

As illustrated in FIG. 24, the method for controlling the camera component 80 according to an embodiment of the present disclosure further includes an act at block 07. At block 07, the microprocessor 35 drives the laser projector 10 to project laser light and transmit a predetermined signal.

The act at block 01 includes an act at block 011. At block 011, the predetermined signal is received.

The act at block 02 includes an act at block 027. At block 027, the second driving circuit 32 is turned off to turn off the laser projector 10, in response to that the predetermined signal is not received within the preset time interval.

In the method for controlling the camera component 80 illustrated in FIG. 24, if the predetermined signal is not received within the preset time interval, it is determined that the microprocessor 35 is malfunctioning, the second driving circuit 32 is turned off to stop powering the first driving circuit 31, so as to turn off the laser projector 10 to prevent the laser projector 10 from continuously emitting laser light and endangering the user. The implementation of the control method may be referred to the foregoing detailed description of the electronic device 100, and details are not described herein again.

Figure 25:
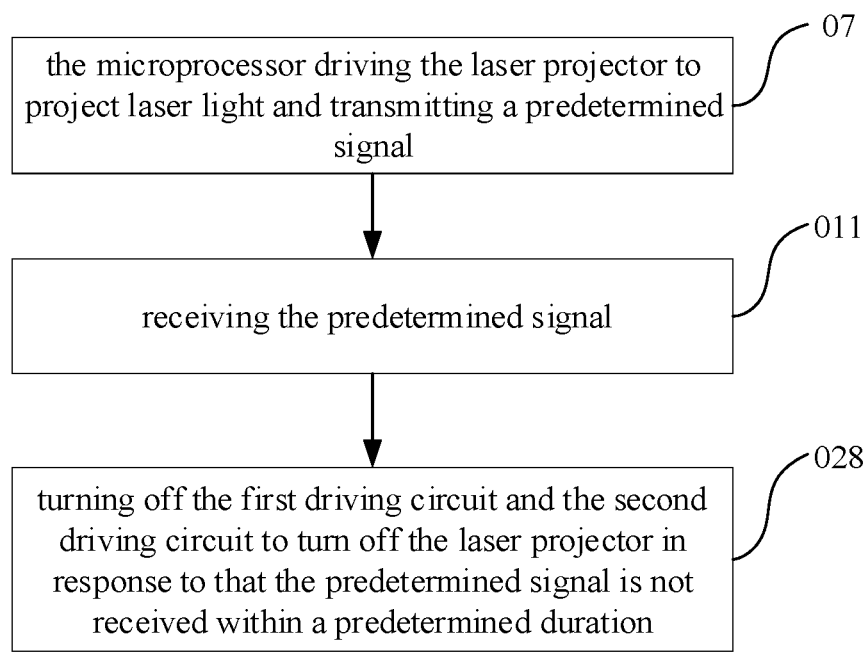

As illustrated in FIG. 25, the method for controlling the camera component 80 according to an embodiment of the present disclosure further includes an act at block 07. At block 07, the microprocessor 35 drives the laser projector 10 to project laser light and transmit a predetermined signal.

The act at block 01 includes an act at block 011. At block 011, the predetermined signal is received.

The act at block 02 includes an act at block 028. At block 028, the first driving circuit 31 and the second driving circuit 32 is turned off to turn off the laser projector 10, in response to that the predetermined signal is not received within the preset time interval.

In the method for controlling the camera component 80 illustrated in FIG. 25, if the predetermined signal is not received within the preset time interval, it is determined that the microprocessor 35 is malfunctioning, the first driving circuit 31 and the second driving circuit 32 are turned off to turn off the laser projector 10 to prevent the laser projector 10 from continuously emitting laser light and endangering the user. In addition, by turning off the first driving circuit 31 and the second driving circuit 32, even if one of the first driving circuit 31 and the second driving circuit 32 is malfunctioning and cannot be directly turned off, one of the first driving circuit 31 and the second driving circuit 32 that operates normally is turned off at least to smoothly turn off the laser projector 10. The implementation of the control method may be referred to the foregoing detailed description of the electronic device 100, and details are not described herein again.

Figure 26:
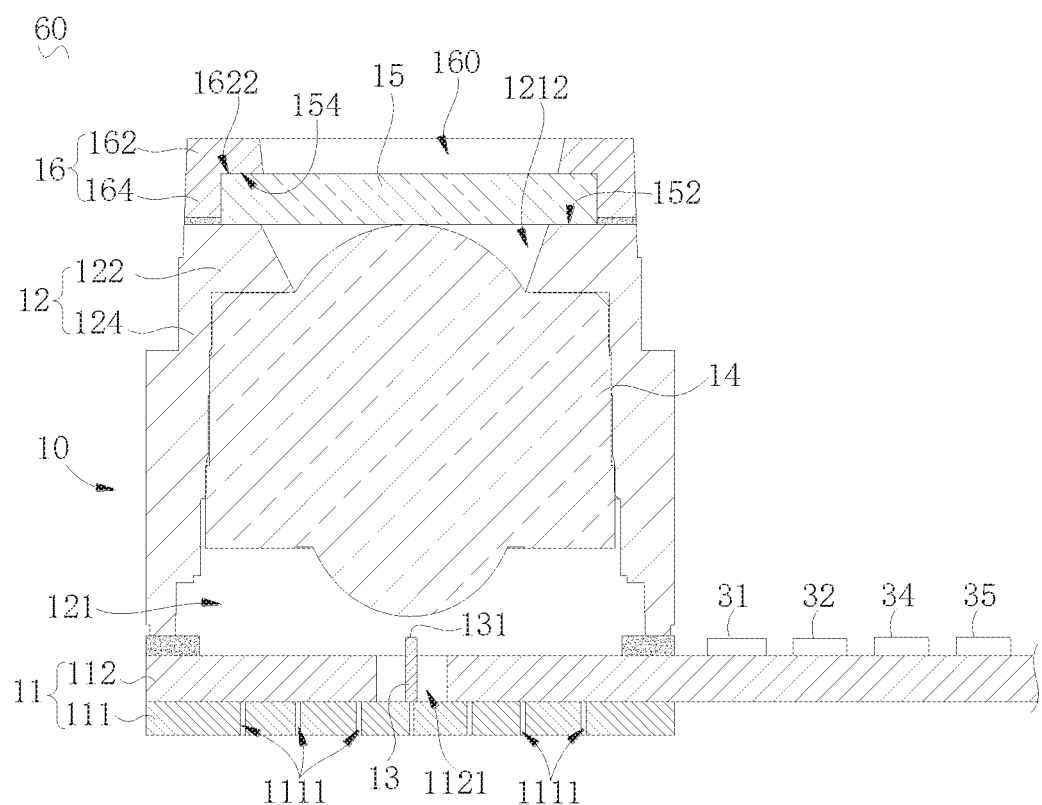
FIG. 26 is a schematic diagram of a laser projection assembly according to embodiments of the present disclosure.

As illustrated in FIG. 26, an embodiment of the present application further provides a laser projection assembly 60 including a laser projector 10, a first driving circuit 31, a second driving circuit 32, a watchdog timer 34, and a microprocessor 35. At this time, the first driving circuit 31, the second driving circuit 32, the watchdog timer 34, and the microprocessor 35 may all be integrated on a substrate assembly 11 of the laser projector 10.

As illustrated in FIG. 26, in some embodiments, the laser projector 10 includes the substrate assembly 11, a lens barrel 12, a light source 13, a collimating element 14, a diffractive optical element (DOE) 15, and a protective cover 16.

The substrate assembly 11 includes a substrate 111 and a circuit board 112. The circuit board 112 is disposed on the substrate 111. The circuit board 112 is configured to be coupled to the light source 13 and a main board of the electronic device 100. The circuit board 112 may be a hard board, a soft board or a soft and hard board. In the embodiment illustrated in FIG. 26, the circuit board 112 is provided with a through hole 1121, and the light source 13 is fixed on the substrate 111 and electrically connected to the circuit board 112. A heat dissipation hole 1111 may be formed on the substrate 111. The heat generated by the operation of the light source 13 or the circuit board 112 may be dissipated by the heat dissipation hole 1111. The heat dissipation hole 1111 may also be filled with thermal glue to further improve the heat dissipation performance of the substrate assembly 11.

The lens barrel 12 is fixedly coupled to the substrate assembly 11. The lens barrel 12 is formed with an accommodation cavity 121. The lens barrel 12 includes a top wall 122 and an annular peripheral wall 124 extending from the top wall 122. The peripheral wall 124 is disposed on the substrate assembly 11, and the top wall 122 is provided with a light passing hole 1212 communicating with the accommodation cavity 121. The peripheral wall 124 may be connected to the circuit board 112 by glue.

The protective cover 16 is disposed on the top wall 122. The protective cover 16 includes a baffle 162 having a light emitting hole 160 and an annular side wall 164 extending from the baffle 162.

The light source 13 and the collimating element 14 are both disposed in the accommodation cavity 121, and the diffractive optical element 15 is mounted on the lens barrel 12. The collimating element 14 and the diffractive optical element 15 are sequentially disposed on the light-emitting path of the light source 13. The collimating element 14 collimates the laser light emitted by the light source 13, and the laser light passes through the collimating element 14 and then passes through the diffractive optical element 15 to form a laser pattern.

Figure 27:
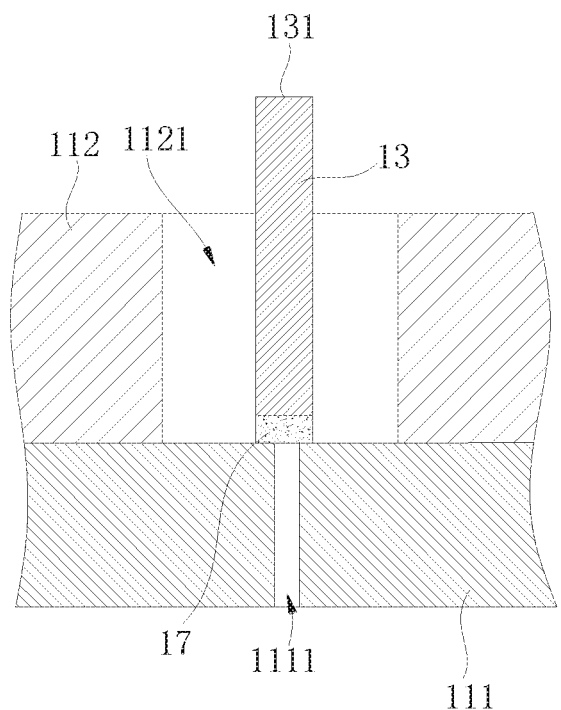
FIGS. 27-29 are schematic diagram of a portion of a laser projector according to embodiments of the present disclosure.
Figure 28:
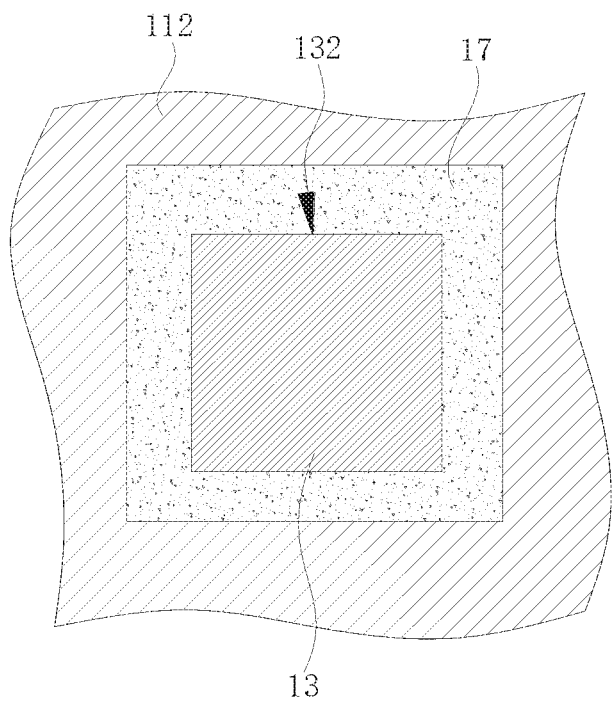

The light source 13 may be a VCSEL (Vertical Cavity Surface Emitting Laser) or an edge-emitting laser (EEL). In the embodiment illustrated in FIG. 26, the light source 13 is an edge-emitting laser. The light source 13 may be a DFB (Distributed Feedback Laser). The light source 13 is configured to emit laser light into the accommodation cavity 121. As illustrated in FIG. 27, the light source 13 has a columnar shape as a whole, and the light source 13 forms a light emitting surface 131 away from one end surface of the substrate assembly 11. The laser light is emitted from the light emitting surface 131, and the light emitting surface 131 faces the collimating element 14. The light source 13 is fixed on the substrate assembly 11. In detail, the light source 13 may be adhered to the substrate assembly 11 by a sealant 17, for example, a side of the light source 13 opposite to the light emitting surface 131 is bonded to the substrate assembly 11. As illustrated in FIGS. 26 and 28, the side surface 132 of the light source 13 may also be adhered to the substrate assembly 11. The sealant 17 encloses the surrounding side surface 132, or only one side of the side surface 132 may be bonded to the substrate assembly 11 or a plurality of faces may be bonded to the substrate assembly 11. In this case, the sealant 17 may be a thermal conductive adhesive to conduct heat generated by the operation of the light source 13 to the substrate assembly 11.

As illustrated in FIG. 26, the diffractive optical element 15 is carried on the top wall 122 and received within the protective cover 16. The opposite sides of the diffractive optical element 15 are respectively in contact with the protective cover 16 and the top wall 122. The baffle 162 includes an abutting surface 1622 adjacent to the light passing hole 1212, and the diffractive optical element 15 is in contact with the abutting surface 1622.

In detail, the diffractive optical element 15 includes a diffractive incident face 152 and a diffractive exit surface 154 opposed thereto. The diffractive optical element 15 is carried on the top wall 122, and the diffractive exit surface 154 is in contact with the surface of the baffle 162 near the light passing hole 1212 (the abutting surface 1622), and the diffractive incident surface 152 is in contact with the top wall 122. The light passing hole 1212 is aligned with the accommodation cavity 121, and the light emitting hole 160 is aligned with the light passing hole 1212. The top wall 122, the annular side wall 164, and the baffle 162 are in contact with the diffractive optical element 15, thereby preventing the diffractive optical element 15 from falling out of the protective cover 16 in the light exiting direction. In some embodiments, the protective cover 16 is adhered to the top wall 122 by glue.

The light source 13 of the laser projector 10 adopts an edge emitting laser. On the one hand, the temperature drift of the edge emitting laser is smaller than that of the VCSEL array. On the other hand, since the edge emitting laser has a single-point light emitting structure, it is not necessary to design an array structure, and the fabrication is simple. The light source of the laser projector 10 is low in cost.

When the laser light of the distributed feedback laser propagates, the gain of the power is acquired through the feedback of the grating structure. To increase the power of the distributed feedback laser, it is necessary to increase the injection current and/or increase the length of the distributed feedback laser. As the injection current increases, the power consumption of the distributed feedback laser increases and the heat generation is severe. In order to ensure that the distributed feedback laser may work normally, it is necessary to increase the length of the distributed feedback laser, such that a distributed feedback laser generally has a slender structure. When the light emitting surface 131 of the edge emitting laser faces the collimating element 14, the side emitting laser is placed vertically, and since the edge emitting laser has a slender strip structure, the emitting laser is prone to accidents such as dropping, shifting or shaking, and the sealant 17 is capable of holding the edge emitting laser to prevent accidents such as dropping, displacement or shaking of the edge emitting laser.

Figure 29:
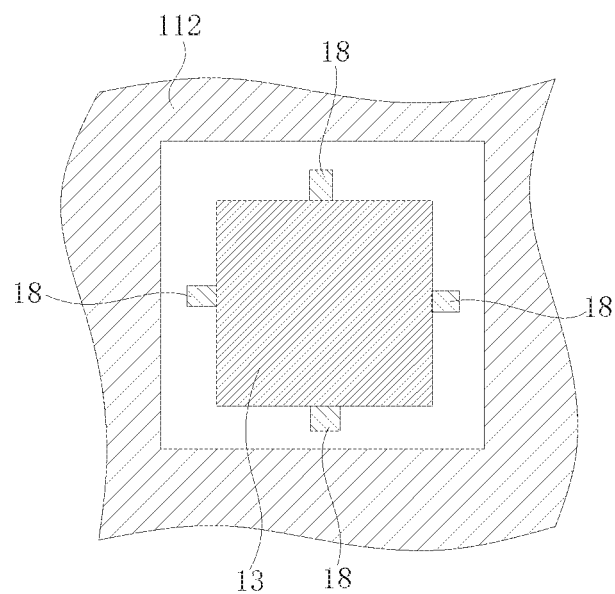

As illustrated in FIGS. 26 and 29, in some embodiments, the light source 13 may also be fixed to the substrate assembly 11 in a manner as illustrated in FIG. 29. In detail, the laser projector 10 includes a plurality of support blocks 18 that may be fixed to the substrate assembly 11, and the plurality of the support blocks 18 collectively enclose the light source 13, and the light source 13 may be directly mounted among the plurality of the support blocks 18 during installation. In one example, the plurality of the support blocks 18 collectively clamp the light source 13 to further prevent the light source 13 from sloshing.

In some embodiments, the protective cover 16 may be omitted. In this case, the diffractive optical element 15 may be disposed in the accommodation cavity 121, and the diffractive exit surface 154 of the diffractive optical element 15 may abut against the top wall 122, and the laser light passes through the diffractive optical element 15 and then through the light passing hole 1212. Thus, the diffractive optical element 15 is less likely to fall off.

In some embodiments, the substrate 111 may be omitted and the light source 13 may be directly fixed to the circuit board 112 to reduce the overall thickness of the laser projector 10.

Figure 30:
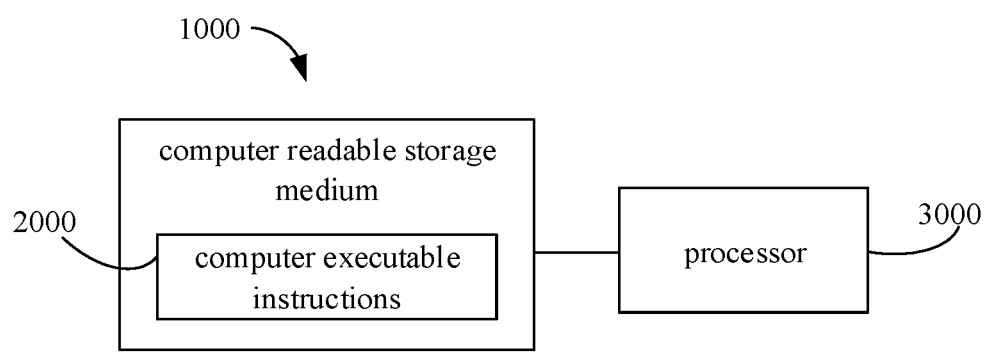
FIG. 30 is a block diagram of a computer readable storage medium according to embodiments of the present disclosure.

As illustrated in FIG. 30, an embodiment of the present disclosure further provides a computer readable storage medium 1000. One or more non-volatile computer readable storage medium 1000 containing computer executable instructions 2000 that, when executed by one or more processors 3000, cause the processor 3000 to execute the method for controlling the camera component 80 in the embodiment of the present disclosure.

The embodiments of the present application further provide a computer program product including instructions, which when executed on a computer, causes the computer to execute the method for controlling the electronic device in the embodiment of the present disclosure.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples may be combined by those skilled in the art.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

Although explanatory embodiments have been illustrated and described, it would be appreciated by those skilled in the art that the above embodiments are examples and cannot be construed to limit the present disclosure, and changes, modifications, alternatives and varieties may be made in the embodiments by those skilled in the art without departing from scope of the present disclosure.

What is claimed is:

1. A system for controlling a camera component in an electronic device capable of facial recognition, wherein the camera component comprises a target camera and a laser projector, the system comprising:
   a target processing unit configured to control the camera component; and
   a first processing unit configured to determine whether the target processing unit writes data to the first processing unit in accordance with a preset time interval when the target camera is in an on state, and at least one of reset the target camera or reboot the electronic device, in response to that the target processing unit does not write data to the first processing unit over the preset time interval,
   wherein the first processing unit is configured to at least one of reset the target camera or reboot the electronic device by acts of:
      disconnecting a driving circuit from the laser projector to turn off the laser projector so as to help prevent the laser projector from damaging human eyes, wherein the driving circuit is located between the first processing unit and the laser projector; and
      transmitting at least one of a reset signal for resetting the target camera or a reset signal for rebooting the electronic device to the target processing unit, such that the target processing unit at least one of resets the target camera or reboots the electronic device.

2. The system of claim 1, wherein
   the target processing unit comprises a first target processing unit and a second target processing unit, coupled in parallel to the first processing unit;
   the first processing unit is configured to determining whether the target processing unit writes data to the first processing unit in accordance with the preset time interval by acts of:
      acquiring a preset first time interval corresponding to the first target processing unit and a preset second time interval corresponding to the second target processing unit; and
      determining whether the first target processing unit writes data to the first processing unit in accordance with the preset first time interval, and whether the second target processing unit writes data to the first processing unit in accordance with the preset second time interval; and
   the first processing unit is configured to at least one of reset the target camera or reboot the electronic device, in response to at least one of that the first target processing unit does not write data to the first processing unit over the preset first time interval, or that the second target processing unit does not write data to the first processing unit over the preset second time interval.

3. The system of claim 1,
   wherein the target processing unit is further configured to acquire a target image collected by the target camera when the target camera is in the on state after at least one of the target camera is reset or the electronic device is rebooted, and detect the target image and determine whether a laser module of the target camera is turned on for a preset period of time according to a detection result.

4. The system of claim 1,
wherein the target processing unit is further configured to, in response to that a number of times that the target processing unit does not write data to the first processing unit over a preset time interval exceeds a first threshold, reduce an emission power of the laser projector in the target camera to a preset power, and control the laser projector to emit laser light at the preset power.

5. The system of claim 4, wherein the target processing unit is configured to:
acquire a distance between a human face and the target camera;
adjust at least one of a shooting frame rate of the target camera or an emission power of the laser projector in the target camera according to the distance; and
control at least one of the laser projector to emit laser light according to the emission power, or the target camera to collect a target image according to the shooting frame rate.

6. The system of claim 1, wherein the target processing unit comprises a first driving circuit and an application processor, the first processing unit comprises a watchdog timer, the data comprises a predetermined signal;
the first driving circuit is coupled to the laser projector;
the application processor is coupled to the first driving circuit and configured to control the first driving circuit to drive the laser projector to project laser light; and
the watchdog timer is coupled to the first driving circuit, and configured to receive the predetermined signal from the application processor, and in response to that the predetermined signal is not received within the preset time interval, turn off the first driving circuit to turn off the laser projector and transmit the reset signal for rebooting the electronic device to the application processor;
wherein the application processor is configured to reboot the electronic device based on the reset signal for rebooting the electronic device from the watchdog timer.

7. The system of claim 1, wherein the target processing unit comprises a first driving circuit and a microprocessor, the first processing unit comprises a watchdog timer, the data comprises a predetermined signal;
the first driving circuit is coupled to the laser projector;
the microprocessor is coupled to the first driving circuit and configured to control the first driving circuit to drive the laser projector to project laser light; and
the watchdog timer is coupled to the first driving circuit, and configured to receive the predetermined signal from the microprocessor, and in response to that the predetermined signal is not received within the preset time interval, turn off the first driving circuit to turn off the laser projector and transmit the reset signal for resetting the target camera to the microprocessor;
wherein the microprocessor is configured to reset the target camera based on the reset signal for resetting the target camera from the watchdog timer.

8. The system of claim 1, wherein the target processing unit comprises a first driving circuit, a second driving circuit, and an application processor, the first processing unit comprises a watchdog timer, the data comprises a predetermined signal;
the first driving circuit is coupled to the laser projector;

the application processor is coupled to the first driving circuit and configured to control the first driving circuit to drive the laser projector to project laser light;
the second driving circuit is coupled to the first driving circuit and configured to power the first driving circuit; and
the watchdog timer is coupled to the second driving circuit, and configured to receive the predetermined signal from the application processor, and in response to that the predetermined signal is not received within the preset time interval, turn off the second driving circuit to turn off the laser projector and transmit the reset signal for rebooting the electronic device to the application processor;
wherein the application processor is configured to reboot the electronic device based on the reset signal for rebooting the electronic device from the watchdog timer.

9. The system of claim 8, wherein the watchdog timer is further coupled to the first driving circuit, and further configured to, in response to that the predetermined signal is not received within the preset time interval, turn off the first driving circuit to turn off the laser projector.

10. The system of claim 1, wherein the target processing unit comprises a first driving circuit, a second driving circuit, and a microprocessor, the first processing unit comprises a watchdog timer, the data comprises a predetermined signal;
the first driving circuit is coupled to the laser projector;
the microprocessor is coupled to the first driving circuit and configured to control the first driving circuit to drive the laser projector to project laser light;
the second driving circuit is coupled to the first driving circuit and configured to power the first driving circuit; and
the watchdog timer is coupled to the second driving circuit, and configured to receive the predetermined signal from the microprocessor, and in response to that the predetermined signal is not received within the preset time interval, turn off the second driving circuit to turn off the laser projector and transmit the reset signal for resetting the target camera to the microprocessor;
wherein the microprocessor is configured to reset the target camera based on the reset signal for resetting the target camera from the watchdog timer.

11. The system of claim 10, wherein the watchdog timer is further coupled to the first driving circuit, and configured to, in response to that the predetermined signal is not received within the preset time interval, turn off the first driving circuit to turn off the laser projector.

12. The system of claim 6, wherein the watchdog timer is integrated in the application processor, or the watchdog timer is disposed outside of the application processor.

13. The system of claim 7, wherein the watchdog timer is integrated in the microprocessor, or the watchdog timer is disposed outside of the microprocessor.

14. The system of claim 1, wherein the preset time interval is selected from [50, 150]milliseconds.

15. The system of claim 8, wherein the first driving circuit is independently packaged as one driving chip, and the second driving circuit is independently packaged as another driving chip; or
the first driving circuit and the second driving circuit are collectively packaged in one driving chip.

16. An electronic device capable of facial recognition, comprising:

a camera component, comprising:
- a target camera; and
- a laser projector; and a system for controlling the camera component, comprising:
- a target processing unit comprising a first driving circuit and a microprocessor; and
- a first processing unit comprising a watchdog timer;

wherein
- the first driving circuit is coupled to the laser projector;
- the microprocessor is coupled to the first driving circuit and configured to control the first driving circuit to drive the laser projector to project laser light; and
- the watchdog timer is coupled to the first driving circuit, and configured to receive a predetermined signal from the microprocessor, and in response to that the predetermined signal is not received within a preset time interval, turn off the first driving circuit to turn off the laser projector so as to help prevent the laser projector from damaging human eyes and transmit a reset signal for resetting the target camera to the microprocessor; and
- the microprocessor is configured to reset the target camera based on the reset signal for resetting the target camera from the watchdog timer.

17. A method for controlling a camera component in an electronic device capable of facial recognition, wherein the camera component comprises a target camera and a laser projector, the method comprising:

receiving data; and at least one of changing an operating state of the camera component or rebooting the electronic device in response to determining that the data is not received within a preset time interval, comprising:
- when the target camera is in an on state, determining whether a target processing unit writes data to a first processing unit in accordance with the preset time interval; the target processing unit being a processing unit for controlling the target camera; and
- in response to that the target processing unit does not write data to the first processing unit over the preset time interval, at least one of resetting the target camera or rebooting the electronic device, wherein at least one of resetting the target camera or rebooting the electronic device comprises:
  - disconnecting a driving circuit from the laser projector to turn off the laser projector so as to help prevent the laser projector from damaging human eyes, wherein the driving circuit is located between the first processing unit and the laser projector; and
  - transmitting at least one of a reset signal for resetting the target camera or a reset signal for rebooting the electronic device to the target processing unit, such that the target processing unit at least one of resets the target camera or reboots the electronic device.

* * * * *